(12) United States Patent
Arnison et al.

(10) Patent No.: US 8,571,300 B2
(45) Date of Patent: Oct. 29, 2013

(54) FOCUS FINDING AND ALIGNMENT USING A SPLIT LINEAR MASK

(75) Inventors: Matthew R. Arnison, Umina (AU); Tuan Quang Pham, North Ryde (AU)

(73) Assignee: Canon Kabushiki Kaisha, Tokyo (JP)

( * ) Notice: Subject to any disclaimer, the term of this patent is extended or adjusted under 35 U.S.C. 154(b) by 387 days.

(21) Appl. No.: 12/912,053

(22) Filed: Oct. 26, 2010

(65) Prior Publication Data

US 2011/0096981 A1    Apr. 28, 2011

(30) Foreign Application Priority Data

Oct. 28, 2009  (AU) ................................ 2009230797

(51) Int. Cl.
*G06K 9/00*    (2006.01)

(52) U.S. Cl.
USPC .......................................... 382/151; 382/255

(58) Field of Classification Search
USPC ........... 382/151, 255; 438/16; 355/44, 55, 56; 250/201.2; 396/89
See application file for complete search history.

(56) References Cited

U.S. PATENT DOCUMENTS

| | | | |
|---|---|---|---|
| 3,013,467 A | 11/1957 | Minsky | |
| 5,053,799 A | 10/1991 | Akashi | |
| 5,300,786 A * | 4/1994 | Brunner et al. | ................ 250/548 |
| 5,589,909 A | 12/1996 | Kusaka | |
| 7,193,685 B2 | 3/2007 | Miura | |
| 7,685,560 B2 | 3/2010 | Nagatomo et al. | |
| 7,705,970 B2 | 4/2010 | Piestun et al. | |
| 2002/0033953 A1 * | 3/2002 | Hill | ................................ 356/516 |
| 2003/0031943 A1 * | 2/2003 | Nakao et al. | ..................... 430/30 |
| 2003/0123052 A1 * | 7/2003 | Ausschnitt et al. | ........... 356/124 |
| 2005/0036122 A1 * | 2/2005 | Nomura et al. | .................. 355/53 |
| 2005/0221207 A1 | 10/2005 | Nagatomo et al. | |
| 2006/0103825 A1 * | 5/2006 | Kondo | ............................ 355/55 |
| 2008/0137059 A1 | 6/2008 | Piestun et al. | |

FOREIGN PATENT DOCUMENTS

JP    8-124838 A    5/1996

OTHER PUBLICATIONS

Australian Notice of Acceptance mailed May 25, 2011, issued in counterpart Australian patent application No. 2009230797.

* cited by examiner

*Primary Examiner* — Jon Chang
(74) *Attorney, Agent, or Firm* — Fitzpatrick, Cella, Harper & Scinto

(57) ABSTRACT

A method of determining a focus parameter for aligning a water in an exposure tool within a measurement tolerance required for the exposure tool, the exposure tool using a lens system for alignment. A test chart is provided having a sharp auto-correlation associated with the wafer. An image of the test chart is captured using a lens pupil mask having at least two phase ramps that are non-parallel. The captured image of the test charge is auto-correlated to determine the position of the test chart relative to a focal position of the lens system. The focus parameter for alignment of the wafer is determined using the determined position of the test chart, whereby the focus parameter is determined within the measurement tolerance required by the exposure tool.

18 Claims, 17 Drawing Sheets

|  no pupil mask | SLP pupil mask |  |
|---|---|---|
| 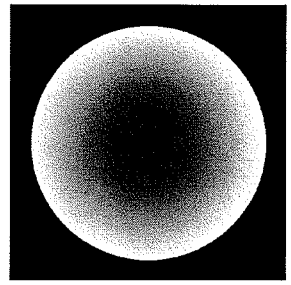 | 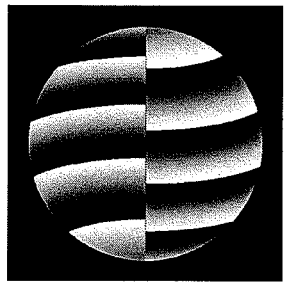 | Fig. 3A<br>-0.4 μm |
| 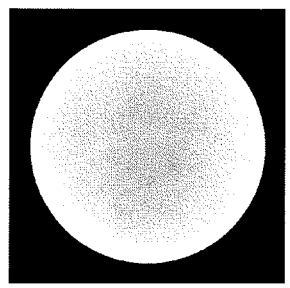 | 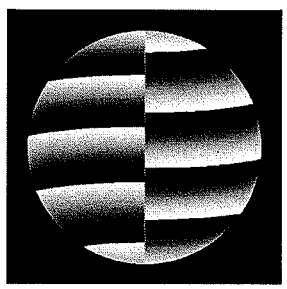 | Fig. 3B<br>-0.2 μm |
| 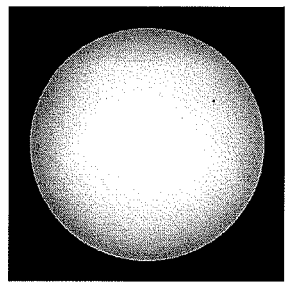 | 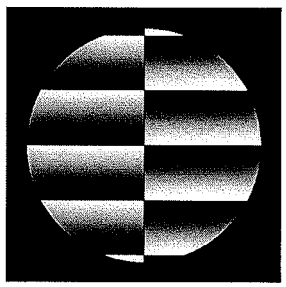 | Fig. 3C<br>focus |
| 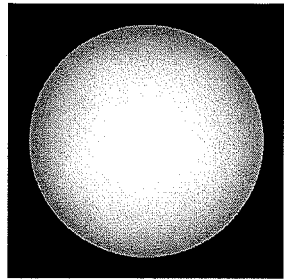 | 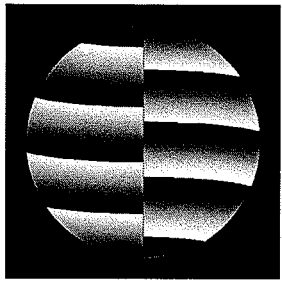 | Fig. 3D<br>0.2 μm |
| 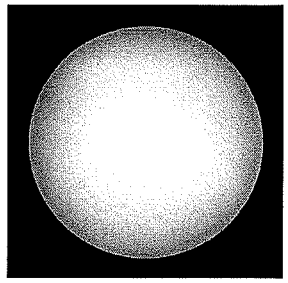 | 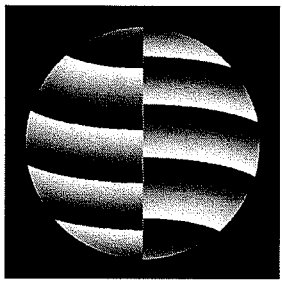 | Fig. 3E<br>0.4 μm |

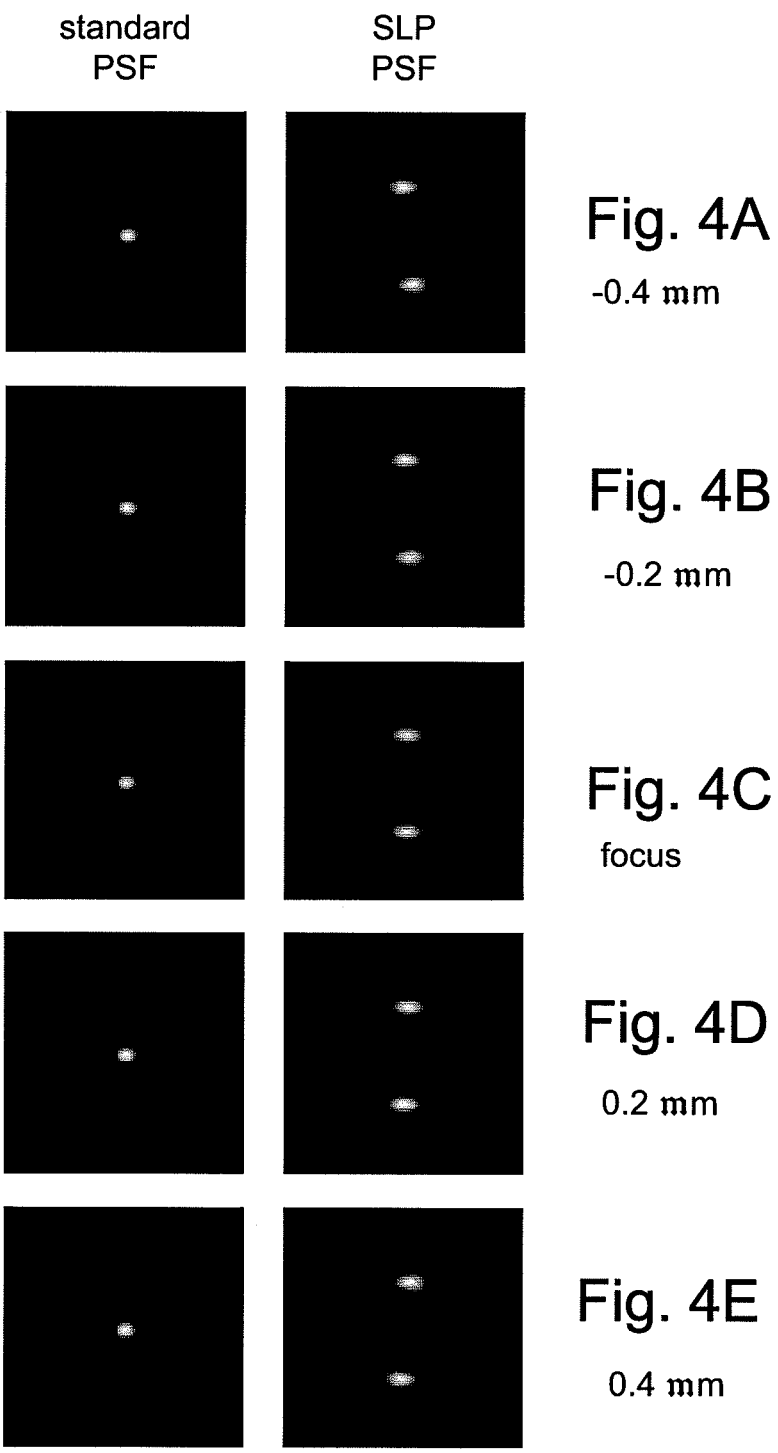

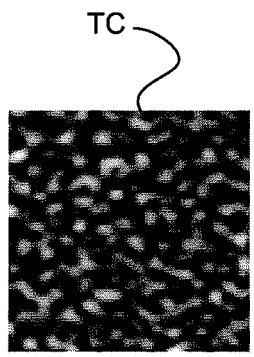 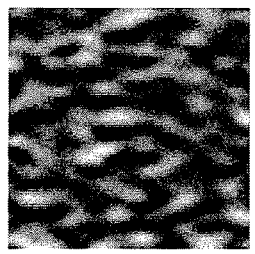 
TC
noise pattern    image at +0.1 um    auto-correlation of image at +0.1 um
Fig. 5A    Fig. 5B    Fig. 5C
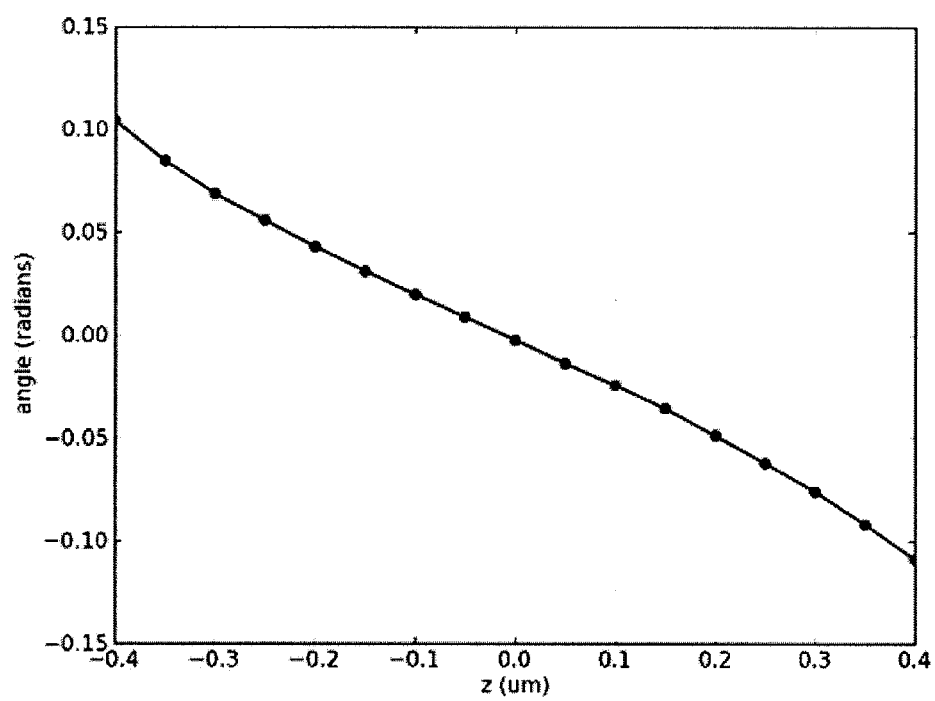
Fig. 6

FOCUS FINDING AND ALIGNMENT USING A SPLIT LINEAR MASK

REFERENCE TO RELATED APPLICATION

This application claims the benefit under 35 U.S.C. §119 of the filing date of Australian Patent Application No. 2009230797, filed Oct. 28, 2009, which is hereby incorporated by reference in its entirety as if fully set forth herein.

TECHNICAL FIELD

The current invention relates to focus finding and alignment in semiconductor exposure equipment and, in particular, to focus finding using a lens pupil mask with a split linear phase, and high spatial frequency bandwidth test patterns.

BACKGROUND

Exposure equipment is used to project an image of a circuit pattern from a reticle onto a wafer in semiconductor device production. Resolution, alignment accuracy, and speed are very important for exposure equipment.

The resolution of an exposure tool determines the minimum feature size that can be created on a semiconductor integrated circuit (IC). The minimum feature size is known as the critical dimension (CD). The performance of the IC depends on the number of features that can be packed onto the semiconductor chip, which depends on the CD.

The resolution of an optical projection system is very sensitive to focus. This is why focus finding is important for exposure equipment.

During semiconductor production, a single wafer is exposed with multiple circuit pattern layers. Between exposures of different circuit patterns, the wafer is removed from the exposure tool for processing, such as deposition, etching, or doping with materials that impart semiconducting properties to the wafer. When the wafer returns to the exposure tool, the new layer has to be precisely focused and aligned to the previous layer. This is why alignment accuracy is important for the exposure equipment.

The time spent on high accuracy focus finding and alignment can have a significant impact on the overall speed of the exposure tool. It is also important that focus finding and alignment are robust, to avoid errors and a need for repeat measurements, so that the overall speed of wafer exposure is further increased.

A common method for focus finding is to measure the image contrast as a function of focus position. The best focus is at the position with maximum image contrast. This is known as contrast auto-focus (AF). An example of contrast AF function is shown in FIG. 1, which graphs the relative association between the focus position and the image intensity standard deviation. The standard deviation of the pixel values over an image region is a measure of the image contrast. One problem with contrast AF is that the maximum image contrast may not be known before measurement begins, because it depends on the lens performance and the object contrast. This means that the contrast needs to be measured over a range of focus positions, and then, the lens should be returned to the position with the highest contrast. A second problem with contrast AF is that the contrast function is symmetric for near focus and far focus positions. This means that contrast measurements need to be made for at least two different focus positions, in order to determine whether the lens is at near focus or far focus. A third problem with contrast AF is that the derivative of the contrast with respect to focus position has a minimum value of zero at the best focus position. This means that the method is less sensitive to focus changes when the lens is close to best focus.

U.S. Pat. No. 5,053,799 (Akashi), granted Oct. 1, 1991, and U.S. Pat. No. 5,589,909 (Kusaka), granted Dec. 31, 1996, describe a camera having an auto-focusing device. A portion of the light from the object being imaged is sent to the AF system using a half-silvered mirror. In the AF system, there are two circular sub-apertures located at a conjugate of the main lens aperture. The intensity is measured at a conjugate of the image plane. The intensity peak changes position depending on whether the object is at near focus or far focus. This method is known as phase-detect AF. The phase-detect response is approximately linear and it is asymmetric with near focus and far focus. The advantage of phase-detect AF is that a measurement at a single focus position can be used to determine the distance and direction required to move the lens to best focus. One disadvantage is that the sub-apertures block most of the light from the object, so the signal-to-noise ratio (SNR) may be low. A second disadvantage is that a separate optical path is required for the phase-detect AF system, which makes the camera system more complicated to manufacture, and requires additional calibration.

U.S. Pat. No. 3,013,467 (Minsky), granted Dec. 19, 1961, describes a method of focus finding in a confocal microscope. A pinhole is inserted into the optical path before the illumination lens, in a conjugate plane to the object. A second pinhole is inserted after the collection lens, in the image plane. A detector is placed behind the second pinhole. The intensity of the signal has a maximum at best focus. An advantage of a confocal system is that the best focus can be measured using the intensity rather than the contrast. Disadvantages of a confocal system are that the pinholes must be carefully aligned, the pinholes block a lot of light that reduces the SNR, and the object or the beam must be scanned to build up a two-dimensional (2D) or a three-dimensional (3D) image. Accurate scanning can take a significant amount of time relative to the speed of wafer alignment and exposure in exposure equipment.

U.S. Pat. No. 7,193,685 (Miura), granted Mar. 20, 2007, describes an exposure apparatus that realizes a highly precise focus calibration, using a modified confocal design when the pinholes are replaced with line-space patterns. This modified confocal design has similar advantages and disadvantages to the confocal system.

U.S. Patent Application Publication No. 2008/0137059 (Piestun et. al.), published Jun. 12, 2008, describes a method of estimating the distance between an object and an optical system. The method involves inserting a pupil mask into the aperture of a lens. If the mask is designed using specific Gauss-Laguerre (GL) functions, then the point spread function (PSF) in the image plane has two peaks that rotate as a function of focus position. The PSF rotation angle is approximately linear, and it is asymmetric with near focus and far focus. The rotation angle is detected by deconvolving the PSF. This is called a GL pupil rotating PSF system. An advantage of this system is that a measurement at a single focus position can be used to determine the distance and the direction required to move the lens. This system is very sensitive to focus position, including close to best focus, and operates over a large depth of field. The system can also be used for measurement of three-dimensional object position, such as fluorescent particles in biological microscopy. In biological applications, it is important to be able to make multiple measurements distributed over a large three-dimensional volume. For example, a large number of fluorescent markers may be measured in live biological cell imaging to investigate cell structure and function. Nanometer accuracy is important for analyzing internal features of the cell. At the same time, it is also important to be able to image an entire cell in three dimensions, which may be several micrometers in diameter, due to the motion of features within the cell, and to be able to image a complete functioning live cell without killing the cell by physical dissection.

The GL pupil rotating PSF system could be used for focus finding and alignment in exposure equipment, but there would be disadvantages. One disadvantage is that the system has a low SNR for typical objects with low spatial frequency bandwidth, which means that the accuracy does not meet the minimum required for exposure equipment, and also means that the method would have not have sufficient robustness to variations in wafer processing. A second disadvantage is that the GL pupil design is complicated to design and to manufacture. The complexity of the design and implementation of the GL pupil mask may also cause increased sensitivity to small changes in the exposure tool caused by variations in temperature and pressure, which could lower the accuracy of focus finding in the exposure equipment, or require additional calibration steps. A third disadvantage is that the focus detection method using deconvolution requires capturing two images with different lens aperture diameters, which would increase the exposure tool alignment time. A fourth disadvantage is that the GL pupil design is optimized for measurement over an extremely large depth of field without any change in the PSF, except for scale and rotation. These constraints on the design are not necessary for application in exposure equipment, because only a single surface needs to be aligned, and an initial coarse focus alignment can be performed effectively by other means. These systems all have disadvantages that would reduce the accuracy, robustness, and speed of the focus finding and alignment, and increase the complexity if these methods were used as part of an exposure equipment system.

SUMMARY

According to one aspect of the present disclosure, our invention provides a method of determining a focus parameter for aligning a wafer in an exposure tool within a measurement tolerance required for the exposure tool, the exposure tool using a lens system for alignment. The method provides a test chart associated with the wafer, the test chart having a sharp auto-correlation, and then captures, using a lens pupil mask, an image of the test chart, the lens pupil mask having at least two phase ramps that are non-parallel. An auto-correlation is performed on the captured image of the test chart to determine the position of the test chart relative to a focal position of the lens system. The focus parameter is then determined for alignment of the wafer using the determined position of the test chart, whereby the focus parameter is determined within the measurement tolerance required by the exposure tool.

Preferably, the phase ramps are linear. Also, the phase ramps are desirably the sum of a linear phase ramp and a defocus phase function.

Typically, the test chart is located on the wafer.

Desirably, the test chart has one or both of a high spatial frequency bandwidth and rotational diversity. In one specific implementation, the test chart is a pseudo-random noise pattern adapted to provide a measurement tolerance required for the exposure tool. The test chart may be a logarithmic radial harmonic function defined as follows:

$$f_1(r;\theta) = Re\{w(r;\theta)r^{j\alpha+p}e^{jk\theta}\}, \quad r > r_0$$

where $\alpha \neq 0$ and $k \neq 0$.

Alternatively, the test chart can be a logarithmic radial harmonic function defined as follows:

$$f_1(r, \theta) = \begin{cases} Re\lfloor w(r, \theta)r^{j\alpha+p}e^{jk\theta} \rfloor, & r > r_0 \\ q, & r \leq r_0 \end{cases}$$

where $\alpha \neq 0$ and $k \neq 0$.

In some implementations, the test chart is an inherent structure of the substrate.

In certain implementations, the phase ramps are wrapped at steps of one wavelength of the illuminating light.

Preferably, the focal parameter is determined by detecting the position of the side-peaks in the auto-correlation image.

In a specific implementation, an alignment parameter for aligning the wafer is also determined by correlating the captured image with one of an ideal test pattern image and a reference image.

Also, the lens may be one of an exposure lens in the exposure tool and an alignment microscope lens in the exposure tool. In some instances, the lens pupil mask is inserted in a conjugate plane of the lens pupil.

According to another aspect, our invention provides a method of focusing a lens system for an exposure tool to align a wafer within a measurement tolerance required for the exposure tool. This method provides a test chart associated with the wafer, the test chart having a sharp auto-correlation and captures, using a lens pupil mask, an image of the test chart, the lens pupil mask having at least two regions with at least two phase ramps that are non-parallel. An auto-correlation is then performed on the captured image of the test chart to determine the position of the test chart relative to a focal position of the lens system. The lens system is then focused to align the wafer using the determined position of the test chart, whereby the wafer is aligned within the measurement tolerance required by the exposure tool.

Other aspects are also disclosed. These include apparatus by which the above methods may be performed, and computer programs and associated storage media by which the methods may be implemented.

BRIEF DESCRIPTION OF THE DRAWINGS

At least one embodiment of the present invention will now be described with reference to the following drawings, in which:

FIGS. 3A to 3E show simulations of the pupil phase with and without a pupil mask for different focus positions;

FIGS. 4A to 4E show simulations of the point spread function produced at the image plane with and without a pupil mask for different focus positions;

FIGS. 5A to 5C show a simulation of the imaging and auto-correlation steps applied to a noise test pattern;

FIG. 6 is a plot of the angle detected from the auto-correlation simulation in FIGS. 5A to 5C;

DETAILED DESCRIPTION INCLUDING BEST MODE

With reference to the exposure equipment discussed above as used for semiconductor manufacture, some of the layers printed on a wafer will include very small features sizes. For correct operation of the integrated circuit being formed, small features at the critical dimension on multiple layers may need to be accurately aligned. This alignment is known as overlay. There are multiple factors that contribute to the overlay, including the accuracy of measuring the alignment. This means that the measurement tolerance of the alignment system in exposure equipment must be less than the overlay tolerance of the fabricated semiconductor circuit. For example, if the CD is 32 nm, then the 3σ overlay tolerance may be 5.7 nm, where σ is the standard deviation of overlay errors.

The present disclosure is directed towards improving focus finding and alignment for exposure equipment.

Figure 2:
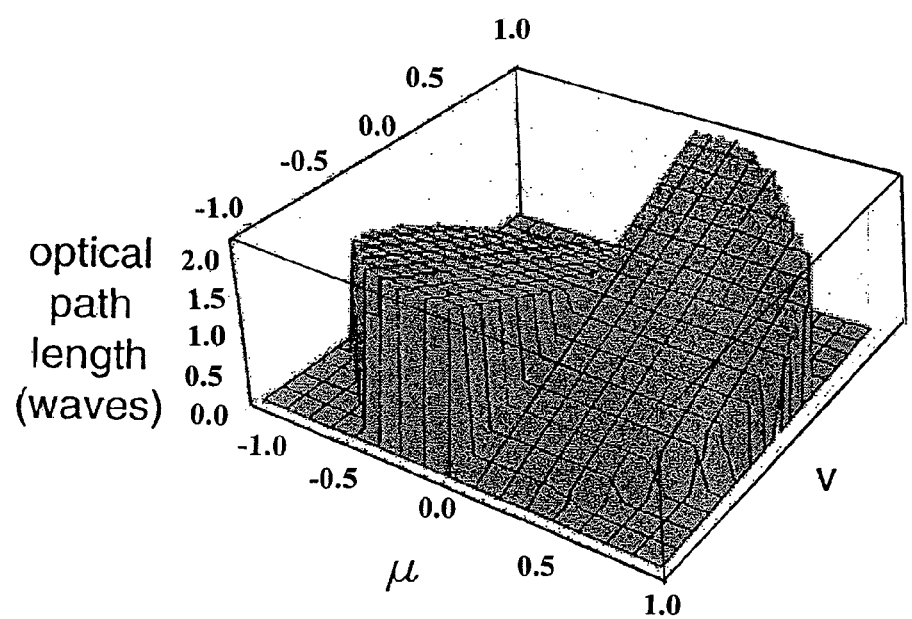
FIG. 2 is a plot of the phase of a split linear phase pupil mask.

A test chart with a sharp auto-correlation peak is used. An example of such a test chart is pseudo-random noise. The test chart may be printed onto the wafer, attached as reference marks to either the wafer stage or the reticle stage, being those structures that support and/or transport the wafer and reticle, respectively, or fabricated on the reticle. A pupil mask is inserted into a conjugate plane of the lens aperture in a lens system within the exposure tool. The amplitude of the pupil mask is preferably constant, with 100% transmission, which means that the mask is optically efficient. The phase of the pupil mask is a pair of phase ramps, with the phase ramps in opposite directions on the left and right side of the pupil. The phase ramps can be fabricated by varying the thickness of a transparent material across the pupil mask, where the thickness increases the optical path length. This is shown in FIG. 2, which shows the optical path length of the pupil mask, plotted against lens pupil coordinates (u, v). The lens pupil coordinates are normalized with respect to the radius of the lens pupil. The optical path length is in waves with respect to the wavelength of monochromatic light used. Broadband light may alternatively be used, which will change the detailed behavior, but the general trends will remain similar.

The PSF produced by the pupil mask has two peaks, as shown in the representations labelled SLP PSF for each of FIGS. 4A to 4E. If a line is drawn from one peak to the other, then an angle can be measured between the line and the vertical image axis. The angle changes as a function of focus position.

An image of the test pattern is captured and analyzed using an auto-correlation. The auto-correlation produces an image with two side-lobe peaks. The angle of the line joining the side-lobe peaks is used to estimate a focus parameter. The focus parameter is then used to move the wafer stage in order to align the wafer at the best focus position.

To measure the transverse position of a single test chart, the captured image is correlated with an ideal image of the test pattern. To measure the relative position of multiple test charts, a captured image of one mark is correlated with a captured image of another mark from the same wafer. It is possible to measure both the focus and the alignment from a single captured image using the presently described arrangements.

The measured PSF angle is approximately linear as a function of focus, and is asymmetric with respect to near focus and far focus. The accuracy and SNR is high due to the high spatial frequency bandwidth of the test pattern. The optical design is relatively simple due to the simple design of the phase function of the pupil mask. The detection speed is fast, because it is based on direct auto-correlation and peak finding. The detection is robust, because the test chart has a sharp auto-correlation, evidenced by a sharp auto-correlation peak.

Exposure Tool System

Figure 10A:
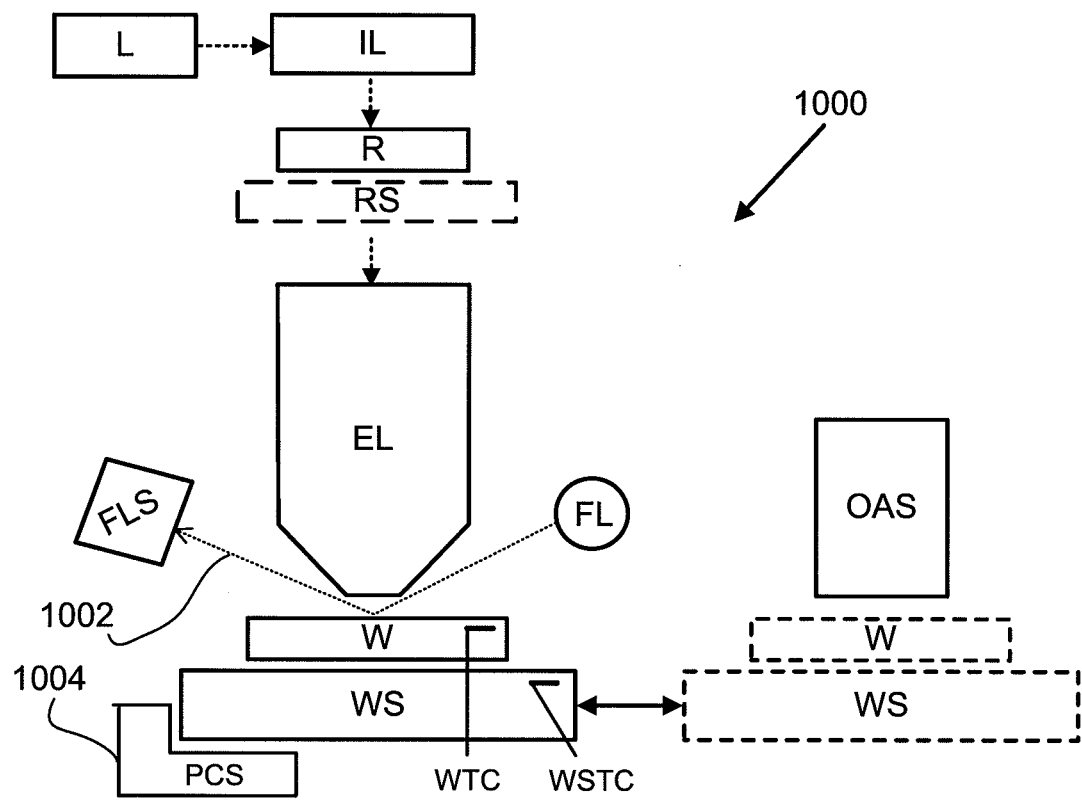
FIGS. 10A and 10B are schematic system diagrams of various exposure tools.

One implementation of an exposure tool system 1000 is shown in FIG. 10A. The exposure tool 1000 is used in semiconductor production to project circuit patterns from a reticle R on to a wafer W. Illumination is provided by a laser L. An illumination wavelength of 193 nm is typically used in high resolution exposure tools, although other wavelengths may be useful in some implementations. Before exposure, the wafer W is coated with a photoresist material that is sensitive to the exposure wavelength.

The illumination beam produced by the laser L is conditioned by an illumination system IL. The conditioned beam then illuminates the reticle R, supported by a reticle stage RS. The beam is projected by an exposure lens EL onto the wafer W. Typical exposure tools often use a magnification of four times, so that features on the wafer W are four times smaller than the features on the reticle R.

The wafer W is mounted on a wafer stage WS. The exposure tool 1000 operates by stepping movement of the wafer stage WS, and thus, the wafer W, to thereby expose a field for multiple dice on the wafer W. Each field is exposed by scanning an illuminated slit, formed using the illumination system IL, in a first direction across the reticle R. The wafer stage WS is scanned in a direction opposite to the first direction to build up an image of the reticle R on the wafer W. The exposure tool may, therefore, be referred to as a "stepper" or a "scanner".

The position of the wafer stage WS is controlled very accurately. After exposure, however, the wafer W is removed from the wafer stage WS, and thus, the exposure tool 1000, for processing of a circuit layer. After such processing is completed, the wafer W is coated with a fresh layer of photoresist and loaded again into the exposure tool 1000 upon the wafer stage WS. A second or further layer is then exposed onto the wafer W. In order to create reliable circuits at high density, it is important that each layer has good alignment with the previous layers. Therefore, after re-positioning of the wafer W upon the wafer stage, re-alignment of the wafer stage WS is essential for accurate circuit formation.

Figure 11:
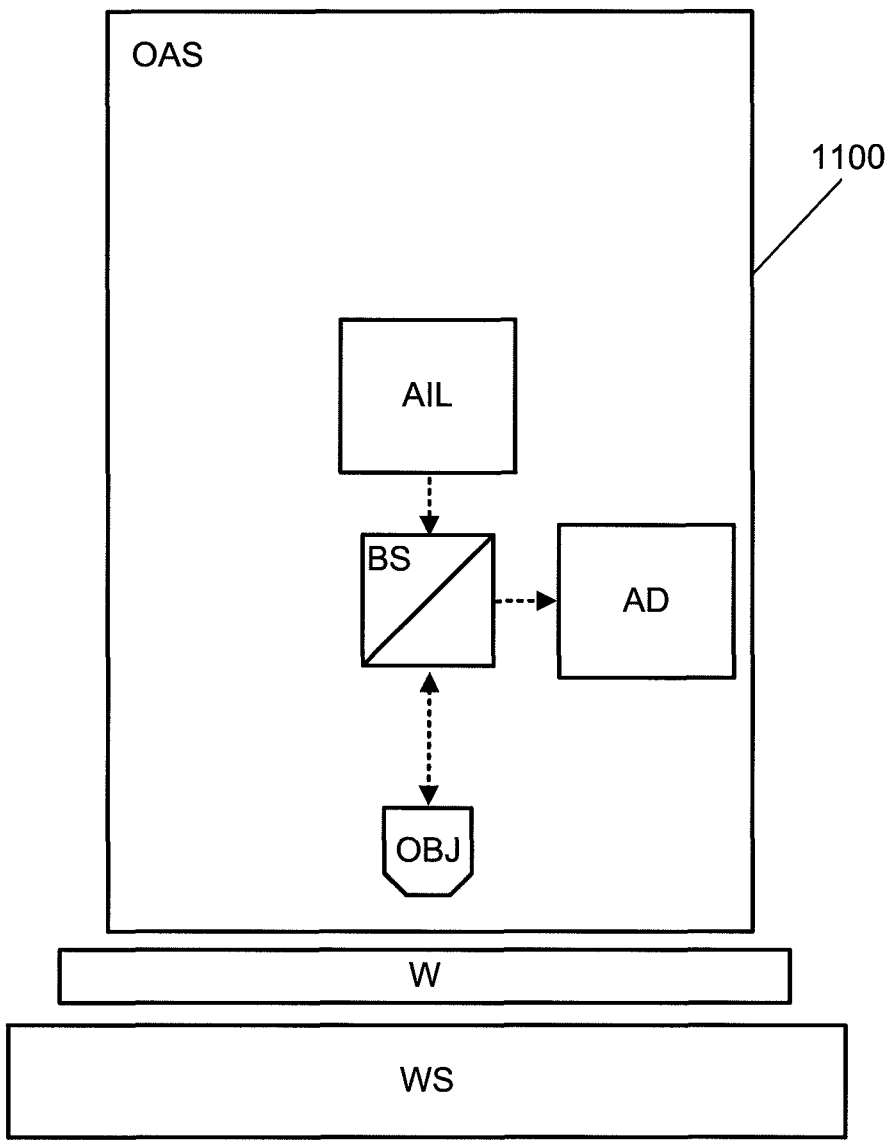
FIG. 11 is a system diagram of an alignment microscope.

The wafer stage WS includes a coarse mechanical alignment that operates using a notch formed in the wafer W. Fine alignment is carried out using an off-axis alignment system (OAS), also seen in FIG. 10A. An example OAS configuration 1100 is shown in FIG. 11. The wafer stage WS and the wafer W are moved to a position under the OAS 1100. An illumination system AIL of the OAS 1100 projects a beam through a beam splitter BS and a microscope objective OBJ onto a wafer test chart WTC fabricated on the wafer W. Light reflected from the wafer test chart WTC is collected by the objective OBJ, transmitted to the beam-splitter BS, reflected from the beam-splitter BS, and detected by an alignment detector AD.

Figure 12:
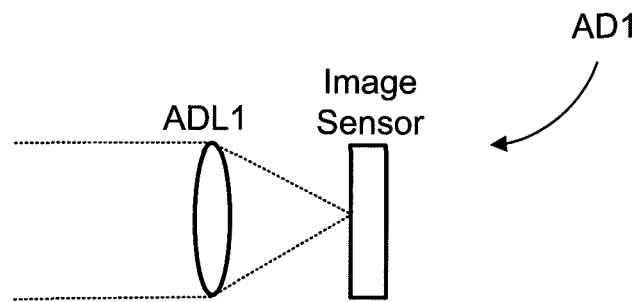
FIG. 12 is a diagram of an alignment detection system.
Figure 13:
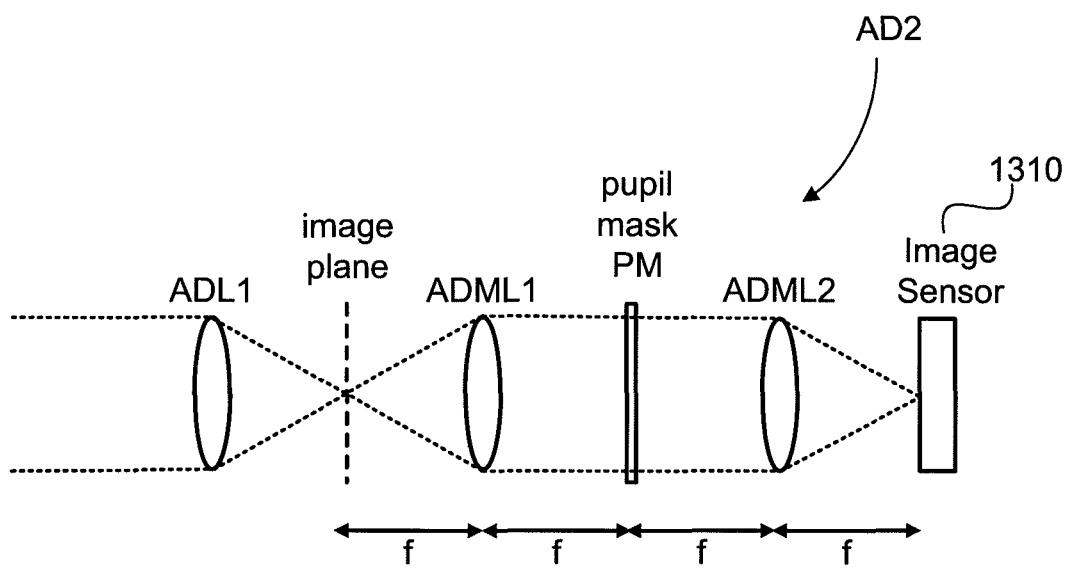
FIG. 13 is a diagram of an alignment detection system with a pupil mask.

An example of a standard alignment detector AD1 is shown in FIG. 12. A field lens ADL1 focuses the reflected beam to form an image plane of the test chart WTC on an image sensor. An alignment detector AD2 altered using a pupil mask according to the present disclosure is shown in FIG. 13. The image plane is relayed through a Fourier filter. The Fourier filter has two lenses, ADML1 and ADML2, each with the same focal length f. The pupil mask is positioned half-way between the lenses ADML1 and ADML2. The filtered image of the test chart WTC is focused on to an image sensor 1310 by the lens ADML2. This arrangement implements a standard 4-f Fourier filter. The image sensor 1310 may be a CCD or a CMOS structured device.

When the altered alignment detector AD2 is used in the exposure tool 1000, the OAS 1100 measures the position of a test chart TC printed as, or as part of, the first layer of the wafer W. Alternatively, the OAS 1100 can be used to measure the position of a wafer stage test chart WSTC attached to the wafer stage TC. The positions of the wafer test chart WTC and the wafer stage test chart WSTC are used together to synchronize a position control system (PCS) 1004 of the wafer stage WS with the position of the wafer W on the wafer stage WS.

The OAS 1100 needs to be accurately focused on the wafer W in order to achieve the maximum accuracy in the alignment measurement. One method for focus finding in the OAS 1100 is to measure the focus using a captured image of a wafer test chart WTC fabricated on the wafer. Because the focus finding and alignment operations are performed each time a wafer W is loaded into the exposure tool 1000, it is important that both operations are fast, accurate, and robust.

Figure 10B:
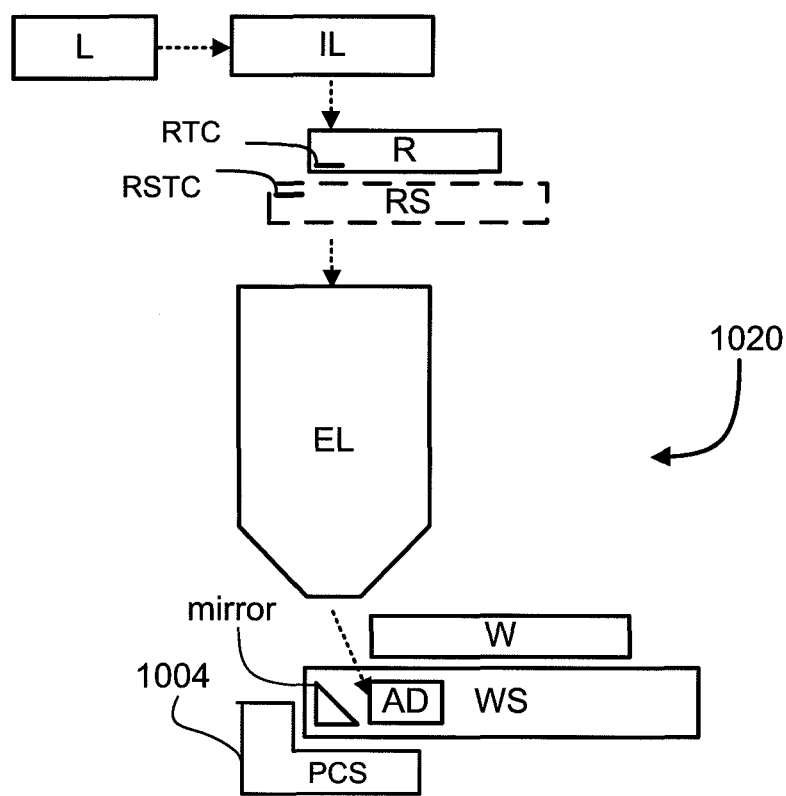

The wafer W needs to be close to the best focus of the exposure lens EL during exposure to achieve maximum resolution in the photoresist. The best focus position of the exposure lens EL can be measured by capturing an image of a reticle test chart RTC on the reticle R or a reticle stage test chart RSTC on the reticle stage RS, as seen in FIG. 10A. The test chart image can be captured by an image sensor that is conjugate to the reticle image plane at the wafer W. For example, an alignment detection system AD, seen in FIG. 10B, can be added to or associated with the wafer stage WS. The alignment detection system AD can have a similar configuration to the alignment detection systems shown in FIG. 12 and FIG. 13. One distinction between the alignment detection system in the OAS, and in the exposure lens EL, is the removal of the field lens ADL1 and the placement of the image plane at the height of the wafer W, or at a plane conjugate to the wafer W. An additional distinction in the configuration shown in FIG. 10B is the addition of a mirror to relay the beam into the alignment detection system.

The wafer height can vary, for example, due to changes caused during baking during wafer processing. The depth of the photoresist coating on the wafer can also vary, depending on the accuracy of the spin coating process that is used to apply a photoresist to a wafer before the wafer is loaded into the exposure tool. A focus laser FL, seen in FIG. 10A, is used to project a further beam onto the wafer W in the focus region of the exposure lens EL. The focus laser FL is at a different wavelength than that of the exposure illumination L, so that the focus laser FL does not expose the resist on the wafer W. The beam from the focus laser FL is reflected from the wafer W and detected by the focus laser system FLS. Changes in the height of the top surface on the wafer W are detected by changes in the position of the reflected beam 1002 at the focus detection system FLS.

The focus detection system FLS cannot accurately detect the height of any alignment marks on a surface below the photoresist. This is because the focus laser will reflect from the first surface, which is the photoresist, but the alignment marks will be on a different surface below the photoresist. In addition, the focus laser beam is much larger than an alignment mark, so the measurement is not accurate if photoresist variations and wafer height variations occur over small regions compared with the size of the focus laser beam.

Pupil Mask Configuration

The standard PSF of an example of an OAS is shown on the left hand side of FIGS. 4A to 4E, for a range of focus positions. An OAS requires high resolution, so a high numerical aperture (NA) lens is required. Each PSF in FIGS. 4A to 4E was calculated using an incoherent vectorial diffraction simulation for a NA of 0.85 in air with linearly polarized illumination at a wavelength of 530 nm. Broadband illumination may be used instead of monochromatic illumination. The illumination may have a different polarization, or be unpolarized. In these cases, the details of the performance will be different, however, the same general behavior will apply.

Figure 1:
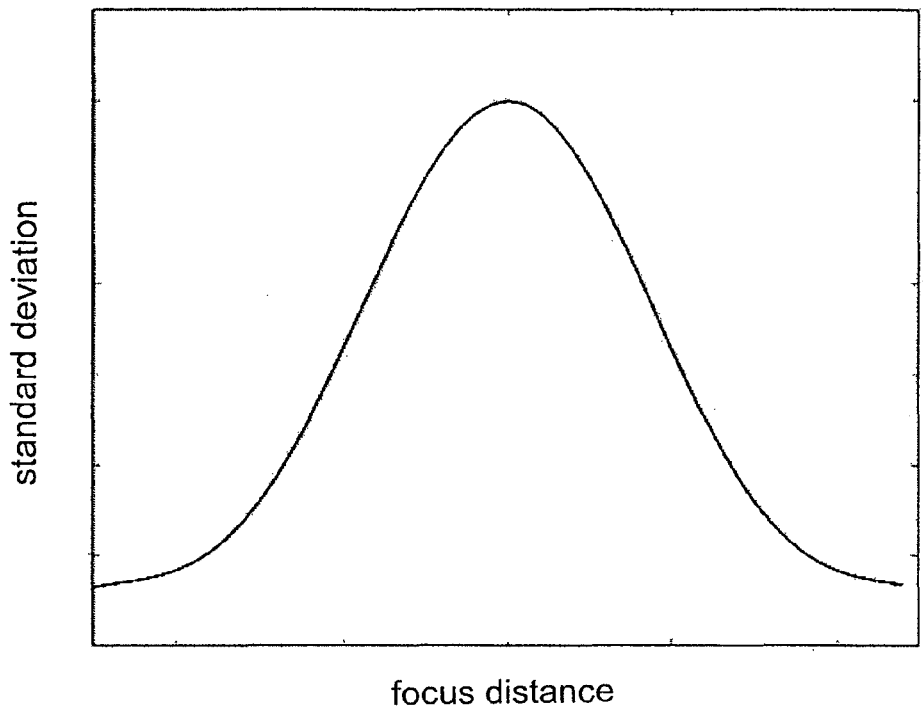
FIG. 1 is an example plot of the image contrast as a function of focus position.

The intensity of a standard PSF is plotted in FIGS. 4A to 4E for several different focus positions around best focus. The results show a small change in the full-width half-maximum (FWHM) over a focal range of 0.8 µm. This is an example of a flat spot in the sensitivity of the image contrast to changes in focus. This is equivalent to the maximum in the plot of image contrast versus focus position in FIG. 1. Because the standard PSF does not change rapidly with focus, measurement of focus position using image contrast has a low SNR. The standard PSF is also symmetric with near and far focus position. This means that a single captured image cannot be used to determine whether the focus position is near or far.

With suitable assumptions, since light is electromagnetic radiation, the time-averaged electric field at the image plane is a Fourier transform of the time-averaged electrical field at the aperture of a lens. The intensity detected by an image sensor is the squared modulus of the electric field. This means that a pupil mask inserted into the aperture of a lens can be used as a spatial frequency domain filter on the image PSF. The transmission of the pupil mask acts as an amplitude filter. The optical path length of the pupil mask acts as a phase filter. The amplitude and phase filtering together act as a complex filter of the electric field in the lens aperture.

A standard lens is called diffraction limited if it delivers the smallest possible PSF that obeys the laws of diffraction for a given aperture size and illumination wavelength. This corresponds to a constant pupil amplitude and phase. In practice, a lens may have aberrations that alter the performance. These can be modelled as wavefront aberrations across the pupil. A change in focus position, or defocus, can be modelled as a wavefront aberration. If the Cartesian coordinates in the lens pupil are (u,v), then moving the focus position along the optical axis by a distance z produces a phase aberration of the form:

$$\psi_d(u, v) = \frac{1}{2} k z \sqrt{1 - (u^2 + v^2)},$$

where $k=2\pi/\lambda$ and $\lambda$ is the illumination wavelength. For small apertures, the defocus phase aberration is approximately parabolic:

$$\psi_{dp}(u,v) = \frac{1}{2}kz(u^2+v^2).$$

Fourier optics can be used to design a PSF that has a different response to defocus. The Fourier shift theorem states that a phase ramp in the spatial frequency domain corresponds to a shift in position in the spatial domain. By applying different phase ramps to different parts of the aperture, when the phase ramps are non-parallel, the PSF can be split into multiple peaks.

An example pupil mask formed using this approach is:

$$\psi_s(u,v) = \alpha v \quad u \geq 0$$
$$\psi_s(u,v) = -\alpha v \quad u < 0,$$

where $\alpha$ is a parameter which controls the strength of the split PSF effect. In this case, the phase ramps are non-parallel, because they have different orientations. This is called a split linear phase pupil mask (SLP). A plot of the optical path length of this pupil mask for $\alpha=1$ is shown in FIG. 2.

When a defocus aberration is applied to a lens with a SLP pupil mask, then the combined phase in the pupil for small apertures is approximately:

$$\psi_c(u,v) = av + \frac{1}{2}kz(u^2+v^2) \quad u \geq 0$$
$$\psi_c(u,v) = -av + \frac{1}{2}kz(u^2+v^2) \quad u < 0.$$

For small values of u, v, and z, the combined phase is approximately a planar function of (u,v), with the angle of the plane proportional to z. Using the Fourier shift theorem, these planar functions correspond to the following approximate offset peak centers in the spatial domain:

$$x_{0L} = \frac{-kz}{4\pi} \quad y_{0L} = \frac{a}{2\pi}$$
$$x_{0R} = \frac{kz}{4\pi} \quad y_{0R} = \frac{-a}{2\pi}$$

where $(x_{0L},y_{0L})$ and $(x_{0R},y_{0R})$ correspond to the left and right sides of the pupil, respectively. The angle $\theta$ of a line drawn between the peak centers and the y axis is a monotonic function of the focus distance z, given by:

$$\theta = \tan^{-1}\left(\frac{kz}{2a}\right).$$

For small values of z, this function is approximately linear with z.

The combined phase calculated using a vectorial diffraction simulation with a lens with NA=0.85 in air and wavelength 530 nm with linear polarization in the x direction is plotted in FIGS. 3A to 3E. The left hand side of each of FIGS. 3A to 3E shows the phase of the pupil without a pupil mask, which is an approximately parabolic phase aberration. The pupil phase is plotted over FIGS. 3A to 3E for several values of defocus as indicated, over a range of 0.8 μm. The pupil phase is shown for the x-polarized component of the pupil function. The image and image PSF in the vectorial simulation were calculated using all three polarization components (x, y and z) of the pupil function.

The right hand side of each of FIGS. 3A to 3E shows the combined phase of a pupil with a SLP pupil mask with $\alpha=2.5$ and several values of defocus. The pupil phase is shown for the x-polarized component of the pupil function. The phase is wrapped at $2\pi$ radians. The two halves of the SLP pupil mask combined phase are approximately planar. However, the planes in each half of the pupil have opposite angles. For the image PSF, this means that different shifts will be applied to the PSF lobe produced by each half of the pupil.

The plots of FIGS. 4A to 4E show the image PSFs that correspond to the pupil phase functions plotted in FIGS. 3A to 3E. The left hand side of FIGS. 4A to 4E shows the standard PSF with several values of defocus over a range of 0.8 μm. The right hand side of FIGS. 4A to 4E shows the SLP PSF, for several values of defocus over the same range. The two lobes in the SLP PSF of FIGS. 4A to 4E show opposite shifts with a change in focus. If a line is drawn between the centers of the two lobes, then the angle between the line and the y axis can be calculated. It will be apparent from FIGS. 4A to 4E that this angle increases monotonically with change in focus from −0.4 μm to 0.4 μm.

Focus Finding and Alignment Detection Using Correlation

Applying the principles described above, the focus position of the exposure tool 1000 or the OAS 1100 can be detected accurately using the SLP pupil mask together with a high bandwidth test chart. In the example of FIG. 10A, when the wafer test chart WTC is formed on the wafer W, as discussed above, the pupil mask PM may be provided in the alignment detection system AD of the OAS. In the example of FIG. 10B, when the reticle test chart RTC is fabricated on the reticle R, as discussed above, the pupil mask PM may be provided in the alignment detection system AD in the wafer stage WS. In each case, the pupil mask remains in a conjugate plane of an aperture of the lens system of the exposure tool 1000 or the OAS 1100.

An example of such a test chart TC is pseudo-random noise, as shown in FIG. 5A. The test chart pattern was produced by generating greyscale pseudo-random noise with a uniform distribution. The pattern was then filtered in the Fourier domain to match the spatial frequency bandwidth of the lens, and the high frequencies were boosted by multiplying the amplitude by the radial spatial frequency co-ordinate $(u^2+v^2)$. These adjustments of the noise pattern were arranged or configured to improve the transmission efficiency of the test chart image through the lens system. Such a noise pattern could be fabricated as a reflectivity modulation of a surface to provide the test chart TC.

A simulated image of the test chart TC captured with a SLP pupil mask with a focus position of 0.1 μm is shown in FIG. 5B. The simulation was performed using the same method and parameters as shown in FIG. 4. Pseudo-random noise with a uniform distribution was added at 10% of the maximum image value to simulate imaging noise for a rapid image acquisition. The simulated imaging noise was generated using a different random seed from the noise pattern in the test chart TC. A random (x, y) transverse translation was added using sync interpolation. The amplitude of the shift was ±/−1 μm in both x and y, using a pseudo-random floating point number from a uniform distribution for the shift on each axis. The simulation also included 12-bit quantization of the image. The images shown in the FIGS. 5A and 5B are 100× 100 pixel windows from the 512×512 pixel images used for the simulation. Each pixel was 66 nm wide. This could be achieved using 2 μm image sensor pixels with a magnification of 30×.

The captured image from the simulation, seen in FIG. 5B, shows two shifted copies of the noise pattern of FIG. 5A. Each copy corresponds to a single lobe from the SLP PSF, because the captured image is equivalent to a convolution of the image PSF with the test chart. The shift between the noise pattern copies is equal to the shift between the centers of the SLP PSF lobes. This shift between the noise pattern image copies changes with focus position as the SLP PSF lobe center positions change. If the test chart image is f(x,y), then the captured image will be approximately:

$$g(x,y) = f(x+x_s, y+y_s) + f(x-x_s, y-y_s)$$

where:

$$x_s = \frac{-kz}{4\pi} \quad y_s = \frac{a}{2\pi}$$

is the shift between the two image copies.

An auto-correlation is a correlation of an image with itself. If the image has pixel values g(x,y) for image co-ordinates (x,y), then the auto-correlation h(x',y') of g(x,y) is:

$$h(x', y') = g(x, y) \otimes g(x, y)$$
$$= \int\int g\left(x + \frac{x'}{2}, y + \frac{y'}{2}\right) g^*\left(x - \frac{x'}{2}, y - \frac{y'}{2}\right) dx\, dy$$

where ⊗ denotes auto-correlation and g* denotes the complex conjugate of g. Auto-correlation can be rewritten as a convolution, and convolution is a distributive operation. Using these properties, the auto-correlation h(x',y') of g(x,y) can be written as:

$$h(x', y') = f(x+x_s, y+y_s) \otimes f(x+x_s, y+y_s) +$$
$$f(x-x_s, y-y_s) \otimes f(x-x_s, y-y_s) +$$
$$f(x+x_s, y+y_s) \otimes f(x-x_s, y-y_s) +$$
$$f(x-x_s, y-y_s) \otimes f(x+x_s, y+y_s).$$

Each of the four correlation terms on the right hand side produces a sharp correlation peak for a total of four peaks. The first two peaks are produced from auto-correlations, which means that the first two peaks are both at the origin. The third and fourth peaks are produced by correlations of shifted copies of the test chart, so that the peaks will be offset in opposite directions by ($\pm x_s, \pm y_s$). The third and fourth peaks are called the side peaks. By measuring the positions of the side peaks in the auto-correlation, it is possible to measure the shift ($x_s, y_s$) between two copies of the same pattern within a single captured image.

An image of the auto-correlation of the simulated captured image at a focus position of 0.1 μm is shown in FIG. 5C. To make the side-peaks visible in the figure, the auto-correlation image has been magnified three times using sync interpolation, inverted, and a gamma applied.

The peak in the center of the auto-correlation image of FIG. 5C corresponds to the self-correlation strength of the overall captured image. The two side-peaks, one above and one below the central peak, correspond to the correlation between the two copies of the noise pattern in the captured image. The shift between the two copies can be measured from the distance between the centers of the side-peaks. Using the line between the centers of the side-peaks, an angle can be determined between the line and the y axis. The angle measured from the simulation is plotted in FIG. 6. The horizontal axis of the plot is the simulated focus position. The vertical axis is the angle in radians.

The side-peak centers were determined to sub-pixel accuracy using image filtering and peak finding. The first step in image filtering was to downsample the simulated captured image by a factor of two, using a nineteen point sync kernel applied separately with edge pixel extension. This step removed high spatial frequency imaging noise that was above the highest spatial frequency transmitted by the lens in the simulation. The next filtering step was to subtract the mean value from the image. The image edges were then blurred using a squared Hamming window eight pixels wide to reduce edge effects. The auto-correlation was then performed on the filtered image. The auto-correlation image was further filtered by cropping to a 150×150 window and squaring the pixel values.

Peak finding was performed by calculating the centroid in a small region around each peak. An alternative method for finding the side-peak centers is to interpolate a small window around each side-peak, and fit a quadratic function to the interpolated pixel values. A further alternative method would be to use the position of the maximum pixel values in the image to find the side-peaks, but typically, this will not have the required accuracy. Because the auto-correlation of a real function is symmetric, only one side-peak center was measured from the auto-correlation image, and the second side-peak was obtained by inverting the coordinates relative to the center of the auto-correlation image. The side-peak centers were used to calculate an angle between the side-peaks and the y axis.

The measured angle shown in the plot of FIG. 6 is monotonic with focus position, and approximately linear. The measured angle is asymmetric with focus, which means that a single measurement of the angle can be used to measure the focus distance. The sensitivity of the measured angle to changes in focus is approximately constant over the range of the plot. The plot shows that the measured angle was not significantly perturbed by the 10% imaging noise added to the captured image in the simulation. This indicates that this focus detection method has a high SNR. Although the measured angle is only approximately linear, the measured angle can be used to look up an accurate focus position using calibration data measured for a specific lens.

The focus detection speed using this method is relatively fast. After capturing a single image of the test chart, the image is filtered and an auto-correlation is performed. The auto-correlation only needs to be calculated in a small window around the center of the auto-correlation image. The side-peaks need to measured by calculating a centroid in a small window around each peak. The final steps are peak fitting, angle measurement, and focus position look up. The entire method is direct, non-iterative, and relies on relatively small amounts of image capture and pixel processing.

The transverse position can be measured using a correlation between the image of the ideal noise pattern and a captured image. To achieve the required accuracy, filtering was performed on the simulated captured image. The first step in image filtering was to downsample the simulated captured image by a factor of two, using a nineteen point sync kernel applied separately with edge pixel extension. The next filtering step was to subtract the mean value from the image. A spatial frequency filter was applied to reduce the strength of low spatial frequencies. The filter was a separable Hamming filter using a seventeen point convolution kernel applied separably in the spatial domain and subtracted from the image. A Hamming window was applied to the image edges. The image was padded with zeroes to prevent edge overlap effects during the correlation. A cross-correlation was then performed. The correlation image was then cropped to 150×150 pixels, and the pixel values were squared. The correlation peaks were found to sub-pixel accuracy by interpolating small regions around maximal pixel values and performing a parabolic fit. An alternative method to cross-correlation is to use phase correlation. Other forms of correlation could also be used, such as optical flow.

Figure 7:
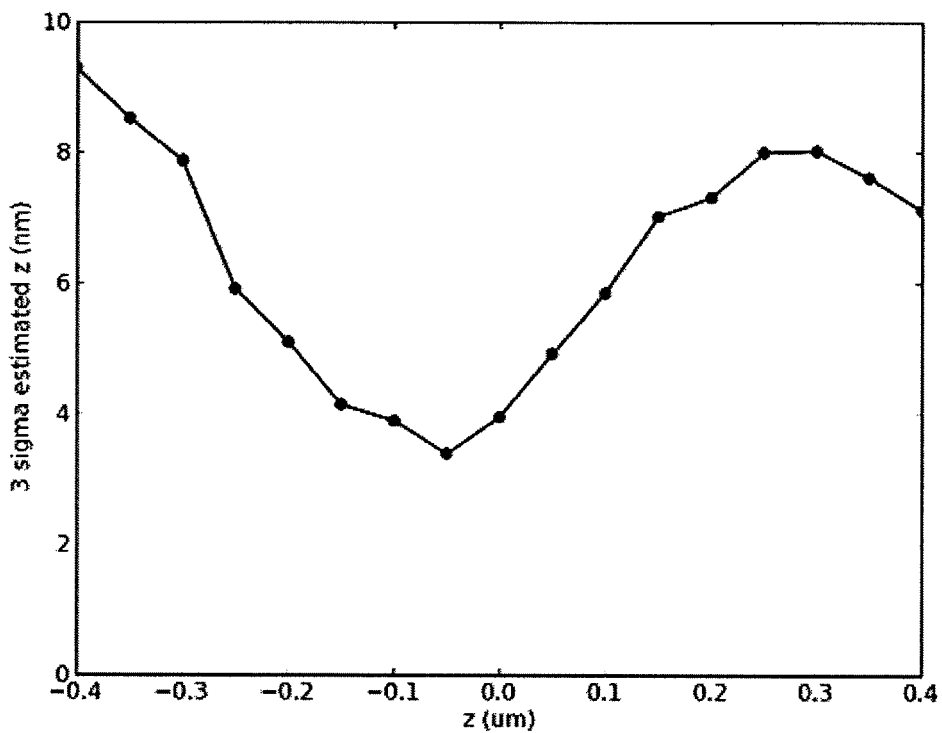
FIG. 7 is a plot of the standard deviation of the detected focus position for the simulation in FIGS.. 5A to 5C.

To quantify the SNR of this focus detection method, the repeatability of the measured focus position is calculated using the simulation. For example, by repeating the simulation one hundred times for each focus position, the standard deviation in the measured angle can be calculated for each focus position. The standard deviation in the angle was converted to approximately the standard deviation in measured focus position using the slope of the plot in FIG. 6. The standard deviation was multiplied by three giving the focus position uncertainty in the standard "3-sigma" convention used in the semiconductor production industry. The results are plotted in FIG. 7. Note that while the horizontal axis of FIG. 7 shows the simulated focus position in micrometers (μm), the vertical axis shows the simulated measured focus position uncertainty in nanometers (nm). The largest 3-sigma for the simulated system was 9.3 nm over a focus range of 0.8 μm.

Figure 8:
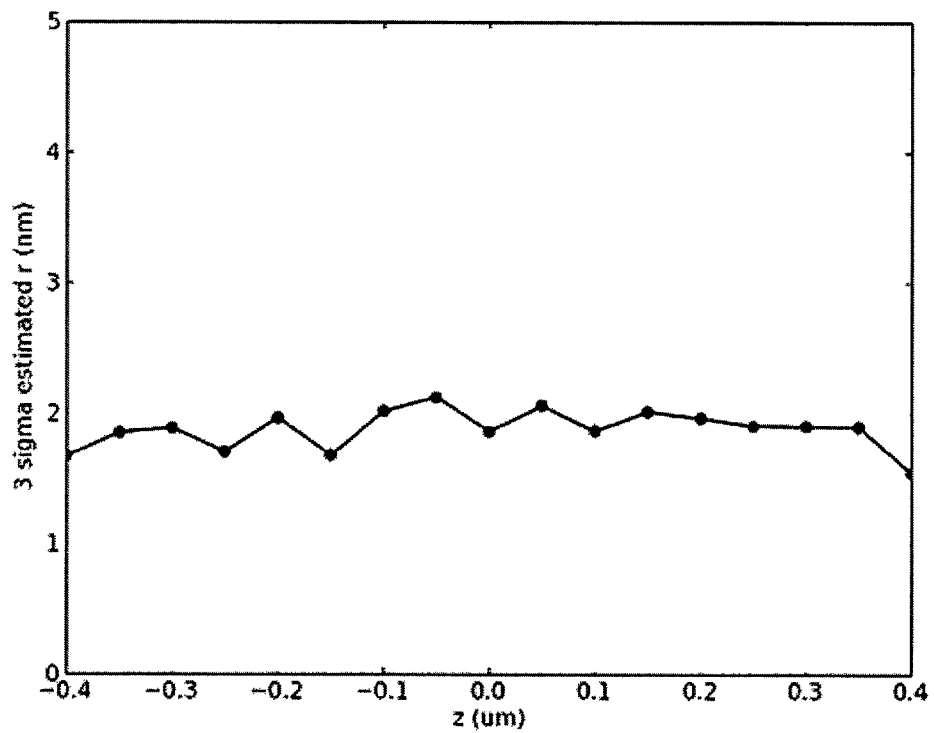
FIG. 8 is a plot of the standard deviation of the detected transverse position for the simulation in FIGS. 5A to 5C.

To quantify the SNR of this alignment detection method, the repeatability of the measured transverse position was calculated using the simulation. The standard deviation in the measured transverse position was calculated over one hundred repeat simulations for each focus position. The 3-sigma of the measured transverse position is shown in FIG. 8. The 3-sigma is below 2.2 nm for a focus range of 0.8 μm.

These results show that the SLP system can detect the three-dimensional position of the wafer with high accuracy from a single captured image. This accuracy is important to ensure that the focus and alignment of the wafer is within the measurement tolerance required for exposing high resolution features using an exposure tool.

In a standard alignment detector AD1, shown in FIG. 12, the alignment detector can detect the three-dimensional position of the wafer. But, the three-dimensional position can only be detected by precise scanning of the height of the wafer stage WS to find the best focus position, and then capturing an image at the best focus to measure the transverse alignment. Accurate focus scanning of the wafer stage WS takes a significant amount of time compared with the desired throughput of an exposure tool. To save time, the focus scan can be performed only once per wafer loading, and the same focus position can be set for capturing an image of each alignment mark. The best focus position can vary across the wafer due to variations caused by wafer processing, which means that the focus accuracy will vary. Using a standard alignment mark and detection method, a decrease in the focus accuracy will also decrease the transverse alignment accuracy.

The SLP system can accurately measure the three-dimensional position of the wafer using a single captured image. Compared with a standard alignment detector, the SLP system can measure the alignment with the same accuracy in less time, or the SLP system can increase the accuracy of a measurement taken in the same time.

The simulation used to obtain the results was appropriate for a specific imaging situation with a specific illumination polarization, wavelength, and NA. The arrangements described can also be used with different imaging conditions. For example, the illumination may be unpolarized broadband visible light. The illumination may be at the actinic wavelength such as 193 nm. The illumination may have a different polarization, and the polarization might be affected by polarization aberrations in the exposure lens. The illumination in some implementations may be coherent or partially coherent, including different aperture shapes, such as dipole or quadrupole illumination. The NA can be significantly different, including immersion in water.

The simulation described above assumed a shift-invariant imaging performance. The performance can change across the image, for example, different image positions might have different PSFs. This variation in performance will change the image of the test chart for different image positions. However, the variation will be similar for each copy of the test chart produced by the SLP pupil mask, because of the small change in image position between the copies. This means that the auto-correlation detection method will be robust to shift-variant imaging.

Alignment System Configuration

The correlations and calculations, to be described with reference to FIGS. 14 to 19 can be performed on a computer as part of a control system for the exposure tool 1000.

Figure 20A:
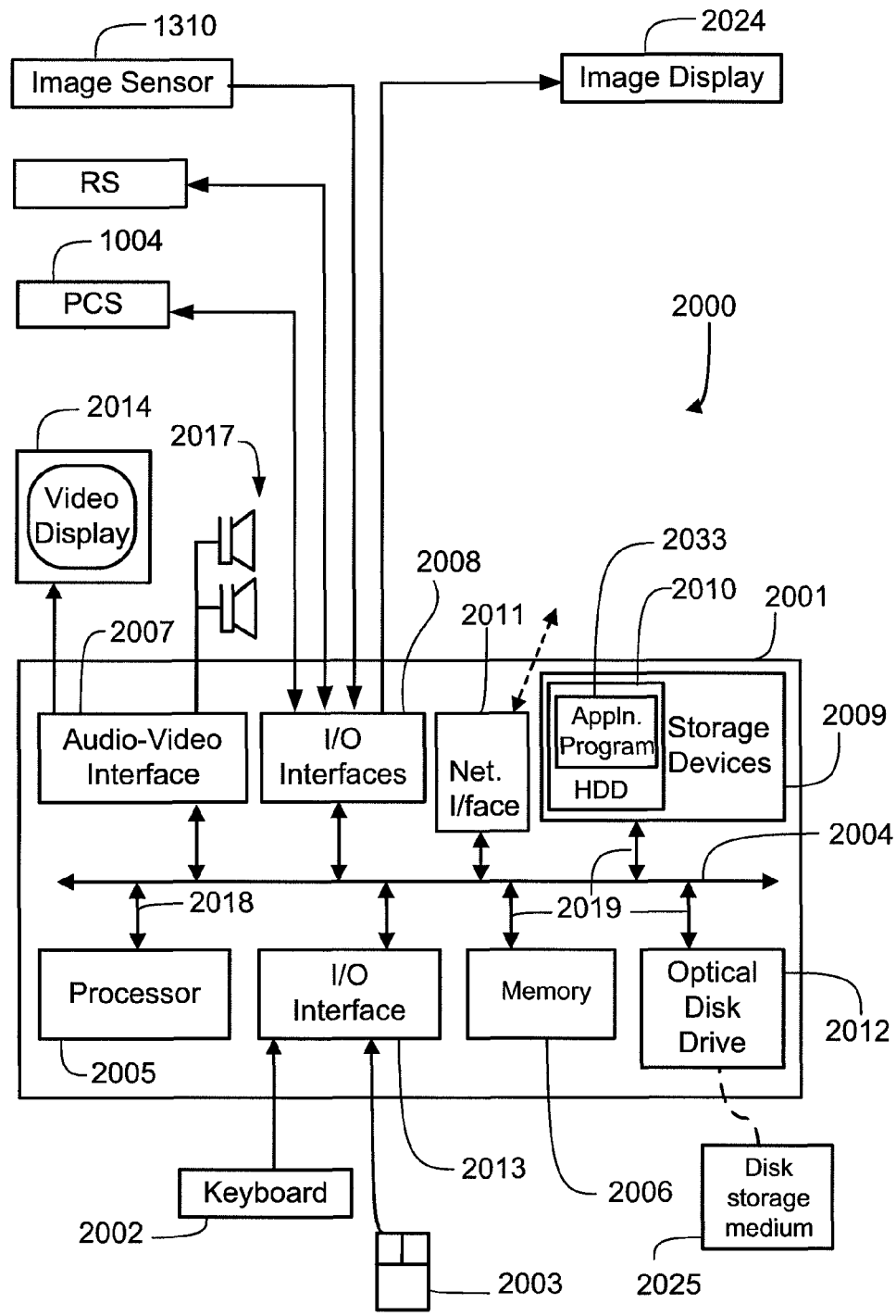
FIGS. 20A and 20B form a schematic block diagram of a general purpose computer system upon which the arrangements described can be practiced.
Figure 20B:
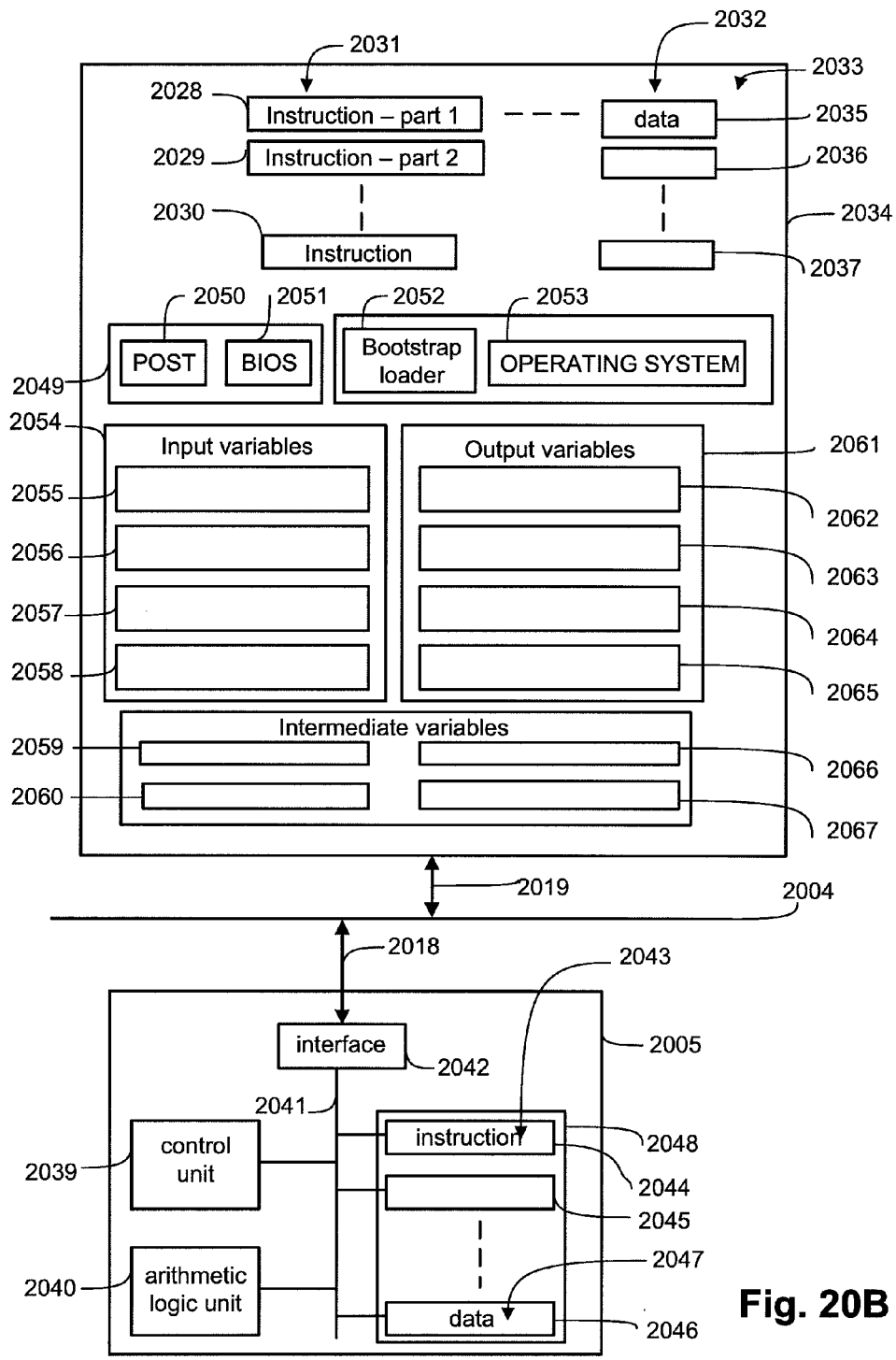

FIGS. 20A and 20B collectively form a schematic block diagram of a general purpose computer system 2000, upon which the various arrangements described can be practiced, and in which couplings to components of the exposure tool 1000 and OAS 1100 are illustrated.

As seen in FIG. 20A, the computer system 2000 is formed by a computer module 2001, input devices, such as a keyboard 2002, a mouse pointer device 2003, and output devices, including a display device 2014 and loudspeakers 2017.

The computer module 2001 typically includes at least one processor unit 2005, and a memory unit 2006, for example, formed from semiconductor random access memory (RAM) and semiconductor read only memory (ROM). The module 2001 also includes a number of input/output (I/O) interfaces including an audio-video interface 2007 that couples to the video display 2014 and loudspeakers 2017, an I/O interface 2013 for the keyboard 2002, mouse 2003, and an interface 2008 for coupling to devices of the exposure tool 1000 and OAS 1100. The interface 2008 may be formed according to any one or more of a number of interface standards such as RS232, Ethernet™, USB 2.0, Bluetooth™ or proprietary arrangements. The computer module 2001 also has a network interface 2011 that can be used to couple the computer system 2000 to a computer network (not illustrated). The interface 2011 may be formed by an Ethernet™ circuit card, a Bluetooth™ wireless arrangement or an IEEE 802.11 wireless arrangement.

The interfaces 2008 and 2013 may afford either or both of serial and parallel connectivity, the former typically being implemented according to the Universal Serial Bus (USB) standards and having corresponding USB connectors (not illustrated). Storage devices 2009 are provided and typically include a hard disk drive (HDD) 2010. Other storage devices, such as a floppy disk drive and a magnetic tape drive (not illustrated), may also be used. An optical disk drive 2012 is typically provided to act as a non-volatile source of data. Portable memory devices, such optical disks (e.g., CD-ROM, DVD), USB-RAM, and floppy disks, for example, may then be used as appropriate sources of data to the system 2000.

The components 2005 to 2013 of the computer module 2001 typically communicate via an interconnected bus 2004 and in a manner that results in a conventional mode of operation of the computer system 2000 known to those in the relevant art. Examples of computers on which the described arrangements can be practiced include IBM-PC's and compatibles, Sun Sparestations, Apple Mac™, or like computer systems evolved therefrom.

The method of focus finding and alignment may be implemented using the computer system 2000, wherein the processes of FIGS. 14 to 19, to be described, may be implemented as one or more software application programs 2033 executable within the computer system 2000. In particular, the steps of the methods of focus finding and alignment are effected by instructions 2031 in the software 2033 that are carried out within the computer system 2000. The software instructions 2031 may be formed as one or more code modules, each for performing one or more particular tasks. The software may also be divided into two separate parts, in which a first part and the corresponding code modules perform the focus finding and alignment methods, and a second part and the corresponding code modules manage a user interface between the first part and the user.

The software 2033 is generally loaded into the computer system 2000 from a computer readable medium, and is then typically stored in the HDD 2010, as illustrated in FIG. 20A, or the memory 2006, after which, the software 2033 can be executed by the computer system 2000. In some instances, the application programs 2033 may be supplied to the user encoded on one or more CD-ROM 2025 and read via the corresponding drive 2012 prior to storage in the memory 2010 or 2006. Alternatively, the software 2033 may be read by the computer system 2000 from a connected network or loaded into the computer system 2000 from other computer readable media. Computer readable storage media refers to any storage medium that participates in providing instructions and/or data to the computer system 2000 for execution and/or processing. Examples of such storage media include floppy disks, magnetic tape, CD-ROM, a hard disk drive, a ROM or integrated circuit, a USB memory, a magneto-optical disk, or a computer readable card, such as a PCMCIA card, and the like, whether or not such devices are internal or external of the computer module 2001. Examples of computer readable transmission media that may also participate in the provision of software, application programs, instructions, and/or data to the computer module 2001 include radio or infra-red transmission channels, as well as a network connection to another computer or networked device, and the Internet or Intranets, including e-mail transmissions and information recorded on Websites, and the like.

The second part of the application programs 2033 and the corresponding code modules mentioned above may be executed to implement one or more graphical user interfaces (GUIs) to be rendered or otherwise represented upon the display 2014. Through manipulation of, typically, the keyboard 2002 and the mouse 2003, a user of the computer system 2000 and the application may manipulate the interface in a functionally adaptable manner to provide controlling commands and/or input to the applications associated with the GUI(s).

The interfaces 2008 couple to components of the exposure tool 1000 and OAS 1100 as illustrated including:

the position control system 1004 for the wafer stage WS for stepping the wafer position between alignment marks, between exposure fields and scanning through the illuminated slit pattern during exposure;

the reticle stage RS for control of scanning of the reticle R through the illuminated slit during exposure; and the image sensor 1310 of the alignment detector AD2 of FIG. 13, which may be formed in the wafer stage WS and/or in the OAS 1100.

FIG. 20B is a detailed schematic block diagram of the processor 2005 and a "memory" 2034. The memory 2034 represents a logical aggregation of all the memory devices (including the HDD 2010 and semiconductor memory 2006) that can be accessed by the computer module 2001 in FIG. 20A.

When the computer module 2001 is initially powered up, a power-on self-test (POST) program 2050 executes. The POST program 2050 is typically stored in a ROM 2049 of the semiconductor memory 2006. A program permanently stored in a hardware device, such as the ROM 2049, is sometimes referred to as firmware. The POST program 2050 examines hardware within the computer module 2001 to ensure proper functioning, and typically checks the processor 2005, the memory (2009, 2006), and a basic input-output systems software (BIOS) module 2051, also typically stored in the ROM 2049, for correct operation. Once the POST program 2050 has run successfully, the BIOS 2051 activates the hard disk drive 2010. Activation of the hard disk drive 2010 causes a bootstrap loader program 2052 that is resident on the hard disk drive 2010 to execute via the processor 2005. This loads an operating system 2053 into the RAM memory 2006 upon which the operating system 2053 commences operation. The operating system 2053 is a system level application, executable by the processor 2005, to fulfil various high level functions, including processor management, memory management, device management, storage management, software application interface, and generic user interface.

The operating system 2053 manages the memory (2009, 2006) in order to ensure that each process or application running on the computer module 2001 has sufficient memory in which to execute without colliding with memory allocated to another process. Furthermore, the different types of memory available in the system 2000 must be used properly so that each process can run effectively. Accordingly, the aggregated memory 2034 is not intended to illustrate how particular segments of memory are allocated (unless otherwise stated), but rather, to provide a general view of the memory accessible by the computer system 2000 and how such is used.

The processor 2005 includes a number of functional modules including a control unit 2039, an arithmetic logic unit (ALU) 2040, and a local or internal memory 2048, sometimes called a cache memory. The cache memory 2048 typically includes a number of storage registers 2044 to 2046 in a register section. One or more internal buses 2041 functionally interconnect these functional modules. The processor 2005 typically also has one or more interfaces 2042 for communicating with external devices via the system bus 2004, using a connection 2018.

The application program 2033 includes a sequence of instructions 2031 that may include conditional branch and loop instructions. The program 2033 may also include data 2032 that is used in execution of the program 2033. The instructions 2031 and the data 2032 are stored in memory locations 2028 to 2030 and 2035 to 2037, respectively. Depending upon the relative size of the instructions 2031 and the memory locations 2028 to 2030, a particular instruction may be stored in a single memory location as depicted by the instruction shown in the memory location 2030. Alternately, an instruction may be segmented into a number of parts, each of which is stored in a separate memory location, as depicted by the instruction segments shown in the memory locations 2028 to 2029.

In general, the processor 2005 is given a set of instructions that are executed therein. The processor 2005 then waits for a subsequent input, to which it reacts to by executing another set of instructions. Each input may be provided from one or more of a number of sources, including data generated by one or more of the input devices 2002, 2003, data received from an external source, such as a connected network or the image sensors such as 1310 and 2022, data retrieved from one of the storage devices 2006, 2009 or data retrieved from a storage medium 2025 inserted into the corresponding reader 2012. The execution of a set of the instructions may, in some cases, result in output of data, for example, for the control of the PCS 1004, wafer stage WS, or reticle stage RS. Execution may also involve storing data or variables to the memory 2034.

The disclosed focus finding and alignment arrangements use input variables 2054, such as captured images from the sensors 1310, that are stored in the memory 2034 in corresponding memory locations 2055 to 2058. The focus finding and alignment arrangements produce output variables 2061, that are stored in the memory 2034 in corresponding memory locations 2062 to 2065. Intermediate variables may be stored in memory locations 2059, 2060, 2066, and 2067.

The register section 2044 to 2046, the arithmetic logic unit (ALU) 2040, and the control unit 2039 of the processor 2005 work together to perform sequences of micro-operations needed to perform "fetch, decode, and execute" cycles for every instruction in the instruction set making up the program 2033. Each fetch, decode, and execute cycle comprises:

(a) a fetch operation, which fetches or reads an instruction 2031 from a memory location 2028;

(b) a decode operation in which the control unit 2039 determines which instruction has been fetched; and (c) an execute operation in which the control unit 2039 and/or the ALU 2040 execute the instruction.

Thereafter, a further fetch, decode, and execute cycle for the next instruction may be executed. Similarly, a store cycle may be performed by which the control unit 2039 stores or writes a value to a memory location 2032.

Each step or sub-process in the processes of FIGS. 14 to 19 is associated with one or more segments of the program 2033, and is performed by the register section 2044 to 2047, the ALU 2040, and the control unit 2039 in the processor 2005, working together to perform the fetch, decode, and execute cycles for every instruction in the instruction set for the noted segments of the program 2033.

Detection Method Details

Figure 14:
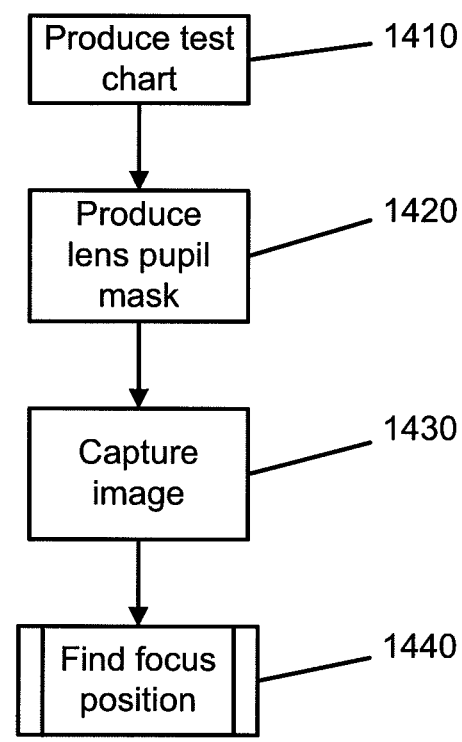
FIG. 14 is a flow chart of a focus finding method.

The focus detection method is shown in a flowchart of a method 1400 of FIG. 14. In an initial step 1410, a test chart is produced. The test chart desirably has a sharp auto-correlation, high spatial frequency bandwidth, and rotational diversity.

The test chart can be placed in different parts of the exposure tool 1000 in order to measure different focus parameters. The focus parameter is a measurement of the test chart position relative to a focal position of a lens system. The lens system could be the exposure lens EL. Alternatively, the lens system could be a microscope objective OBJ in the off-axis alignment system OAS inside the exposure tool 1000.

The test chart may be produced on an exposure reticle R using chrome on glass, or on a chrome on glass transmission plate attached to the reticle stage RS. These alternatives are illustrated in FIG. 10B, in which the pupil mask PM is formed in the alignment detection system AD in the wafer stage WS. A focus parameter of the reticle R may be determined by capturing an image of the test chart with an image sensor attached to the wafer stage WS in a conjugate plane to the wafer W, through the exposure lens EL. The focus parameter is the position of the test chart relative to the focal position of the exposure lens EL. If the position of the reticle R is known, this can be used to measure a focus parameter of the position of the wafer stage WS relative to the reticle R and exposure lens EL.

Alternatively, the test chart may be produced on the wafer W by exposure and processing from a design or a pattern on the reticle R. This is seen in FIG. 10A. This test chart location allows measurement of a focus parameter of the wafer W relative to the OAS. In other cases, the test chart might be on a plate attached to the wafer stage WS and imaged using the OAS. This allows measurement of a focus parameter of the wafer stage WS relative to the OAS. The same test chart can also be used for measuring the transverse position, or transverse alignment, in addition to the focus parameter, or axial alignment. The different locations for the test chart allow for testing the focus and alignment between the reticle R, the reticle stage RS, the wafer W, and the wafer stage WS. It is important to focus and to align all of these parts of the exposure tool 1000, in order to ensure accurate focus and alignment between the reticle R, the exposure lens EL, and the wafer W, before proceeding with exposure of the wafer W.

The test chart contrast may be produced using deposition of different materials on the wafer W, for example, tungsten plugs in a silicon substrate. The test chart contrast could be a binary function of two different materials, or the test chart contrast could be a greyscale function using a variation in material density or approximately greyscale using a high resolution half-tone pattern.

In step 1420, the lens pupil mask is produced. An example lens pupil mask is a split linear phase arrangement that has regions with linear phase ramps that are non-parallel because the ramps have different orientations. Other configurations based on the same principles may alternatively be developed. For example, the lens pupil mask may have different phase ramp regions that have the same orientation, but which are non-parallel, because they have different slopes.

As another example, the aperture of the illumination system IL, which is conjugate with the aperture of the exposure lens EL, may have four circular transmission regions to improve imaging of horizontal and vertical circuit features. Such an aperture shape is called a quadrupole. The pupil mask configuration may be adjusted to have four regions with different linear phase ramp slopes and orientations. Each linear phase region in the pupil mask corresponds to one transmission region in the quadrupole mask. This kind of change in the pupil mask configuration produces additional peaks in the PSF and in the auto-correlation. The detection method is modified to detect the additional peaks, but the overall approach is broadly similar.

The phase ramps need not be linear. For example, the phase ramp in each region of the pupil mask could be calculated from the sum of a linear phase ramp and a defocus phase function. An example defocus phase function is a function that is parabolic as a function of pupil radius. If the slope and orientation of the linear phase ramp is different for each region, and the defocus power is different for each region, then the PSF includes several peaks at different transverse and axial positions. This may be used to increase the defocus tolerance of the focus and alignment measurement.

The pupil mask may be fabricated using a method that is capable of producing accurate variations in height over a transparent surface that is large enough to cover the lens aperture. The fabrication method, for example, may be similar to the plastic molding methods used to create aspheric lenses. Alternatively, the pupil mask may be formed using a spatial light modulator (SLM). This would provide the advantage of being able to dynamically control the pupil mask.

Another method for fabricating an SLP pupil mask is to use a pair of optically flat mirrors with a very small change in tilt between the mirrors. The optical beam could be reflected from the mirrors as part of a folded beam path.

The SLP pupil mask phase may vary by more than a wavelength of the illuminating light. In this case, the phase can be wrapped in steps of one wavelength in order to reduce the total thickness of the pupil mask along the optical axis.

In step 1430, an image is captured of the test chart. In one implementation, an image of the wafer test chart WTC on the wafer W may be captured by the sensor 1310 in the alignment microscope operating at visible wavelengths. This could be used to measure the focus and alignment of the wafer W on the alignment microscope. In another implementation, an image of the test chart on the reticle R is captured, for example, by the sensor 1310 positioned underneath the wafer stage WS at the actinic wavelength of the exposure tool, for example, 193 nm. This may be used to measure the focus of the exposure lens EL and the alignment between the reticle R and the wafer stage WS.

In step 1440, the focus position is measured using the captured image. The focus position can be measured using an auto-correlation of the captured image. This measurement may be performed entirely within the computer 2001 through software execution operating on the captured image.

Figure 15:
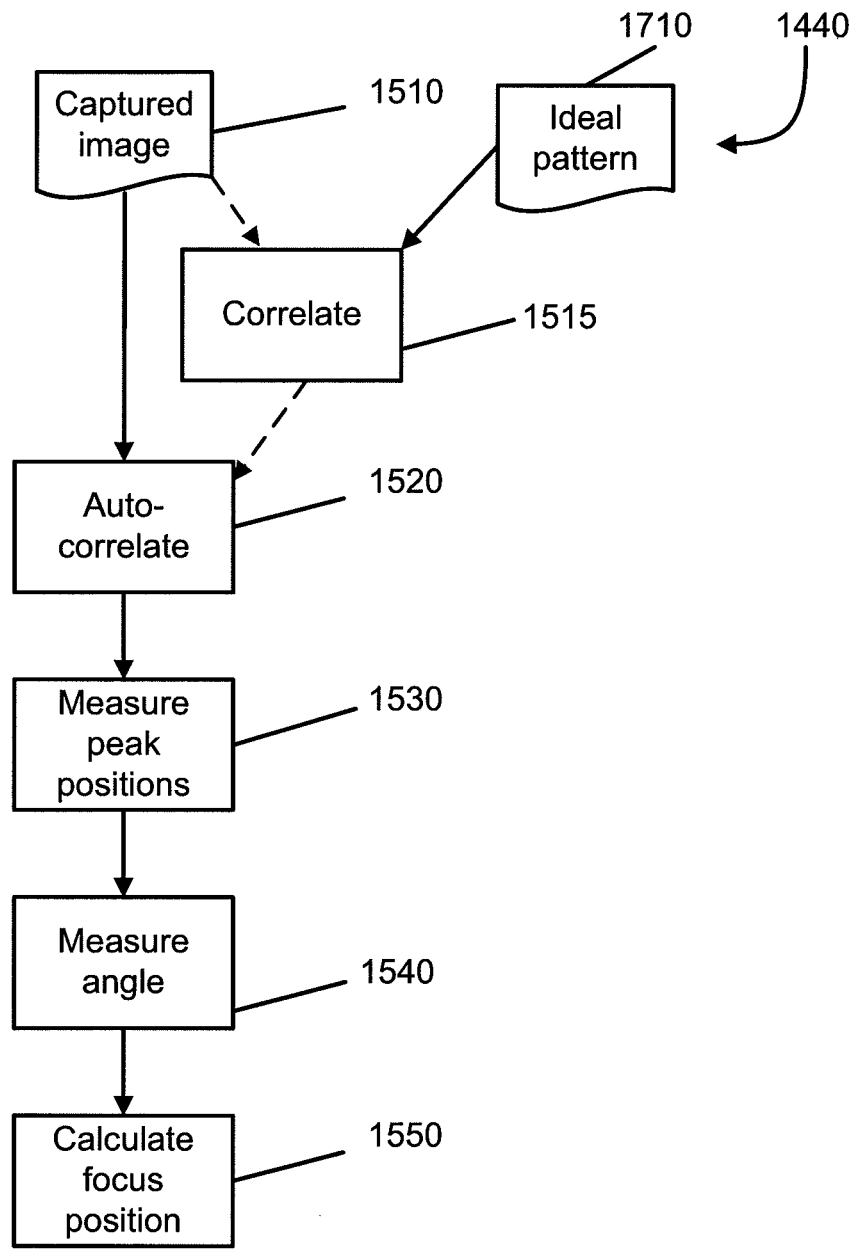
FIG. 15 is a flow chart of the focus position detection method of FIG. 14.

Step 1440 is expanded to show more detailed steps in FIG. 15. The captured image is shown as an input at step 1510. In step 1520, the captured image is auto-correlated. This produces an auto-correlation image with a large central peak and two side-peaks (e.g., akin to that shown in FIG. 5C). The sharpness of the auto-correlation peaks can be enhanced using image filtering operations such as downsampling, edge windowing and blurring, subtraction of the mean image value, and squaring the pixel values.

The sharpness of the peaks in the auto-correlation image depends on the auto-correlation sharpness of the test chart pattern. One example of a test chart pattern is a noise pattern that produces a sharp auto-correlation peak. To increase the strength of the auto-correlation side-peaks, a test pattern with high spatial frequency bandwidth and rotational diversity should be used. A two-dimensional (2D) pseudo-random noise pattern has these characteristics. The rotational diversity is important for detection accuracy at multiple focus positions, because the rotation of the PSF depends on the focus position. The spatial frequency bandwidth and rotational diversity can be adapted to ensure that the overall focus and alignment measurement accuracy is within the measurement tolerance required by the exposure tool. For example, high spatial frequencies could be boosted in the test chart in order to compensate for a decrease in high spatial frequencies caused by test chart projection by an exposure lens on to a wafer.

Figure 9:
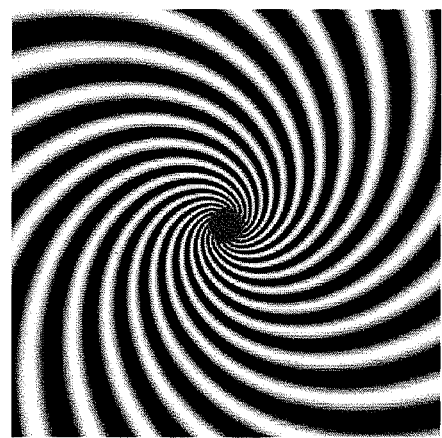
FIG. 9 is a plot of a logarithmic radial harmonic function test pattern.

An alternative test chart pattern with high spatial frequency bandwidth, a sharp auto-correlation and rotational diversity is a logarithmic radial harmonic function (LRHF). The LRHF is defined as a complex function in polar coordinates $(r, \theta)$ as follows:

$$f_1(r, \theta) = \begin{cases} \text{Re}\lfloor w(r, \theta) r^{i\alpha+p} e^{ik\theta} \rfloor, & r > r_0 \\ q, & r \leq r_0 \end{cases}$$

where k is an integer parameter, $\alpha$ and p are real parameters of the function, $w(r, \theta)$ is a weighting function, q is a constant, "Re" is an operator that takes the real part of a complex function, and $r_0$ is a radius used to suppress high frequencies, which are beyond the Nyquist limit of an imaging device. The LRHF test chart has a spiral shape, as shown in FIG. 9.

LRHF functions have the property that images or patterns generated according to these functions are invariant under changes of scaling and rotation of the coordinate system, except for a multiplicative constant. The position of an LRHF pattern in a captured image can be accurately and rapidly detected using correlation with the ideal (original) LRHF pattern. Significant geometric image distortion can also occur due to perspective warp and radial lens distortion. These distortions can be approximated as an affine transform for local regions of the image, but the LRHF pattern is only invariant to scale and rotation. This restriction of the LRHF pattern can be accommodated using the following assumptions and constraints. It can be assumed that the perspective warp is small, because the test chart is set up to be approximately parallel to the image sensor plane. It can also be assumed that the radial lens distortion is small in an exposure tool lens or an exposure tool alignment microscope because such lenses are normally telecentric. Therefore, the auto-correlation of an LRHF pattern should be robust to image scale and rotation changes, as for the noise pattern. The correlation of a captured image of an LRHF pattern with an image of an ideal LRHF test chart should also be robust to scale and rotation changes, which is important for the alignment detection methods, to be described with reference to FIG. 16. The robustness to scale changes also means that LRHF test patterns and images could be useful for coarse focus finding and coarse alignment.

Another alternative test chart pattern that can be used is the inherent structure in the wafer W, wafer processing, or circuit design. For example, there may be a fine random structure in the surface of the wafer W. Wafer processing may produce random structure, which appears in captured images. Regions within the circuit design may have complex fine structure. If this structure has sufficient spatial frequency bandwidth, is stable, and persists through multiple layers of processing, then it is suitable for both focus finding and relative alignment. Relative alignment between layers may be performed by capturing an image of the wafer or circuit structure on one layer, saving the captured image as a reference image, and, on the next layer, capturing an alignment image and correlating it with the saved reference image.

The captured image 1510 might have significant image distortions. For example, the captured image 1510 may have a different scale or rotation from the ideal test pattern. The lens, which may be the lens of an alignment microscope or a lens system of an exposure lens may have aberrations or distortions. Processing of the test chart, such as by wafer processing of a wafer onto which the test chart has been projected and formed, may distort the captured image 1510 of the test chart. The auto-correlation step is robust to a wide variation in these image distortions. This step in the auto-correlation depends on the correlation between the two copies of the test chart image produced by the two side-peaks in the SLP PSF. Each image copy will generally include the same aberrations and distortions. This means that the auto-correlation peaks will be strong and remain sharp for a wide range of wafer processing operations and imaging conditions.

The captured image 1510 might include significant features in addition to those of the test chart image. For example, if coarse alignment is used to find the test chart on the wafer W, then other features on the wafer W nearby may also be included in the captured image 1510. Alternatively, the test chart might be affected by a distortion caused by wafer processing, which produces a systematic pattern. If these additional features or distortions have any repeating structure, then they will produce peaks in the auto-correlation image. Typically, the peaks produced by the test chart in the auto-correlation image will be stronger than the peaks produced by additional features or distortions. To improve robustness, in an optional step 1515, the captured image 1510 can be cross-correlated with an ideal test chart 1710, to produce initial approximate peak positions. Since the cross-correlation peak strength will be lowered by distortions caused by the imaging system and wafer processing, these initial approximate peak positions can be refined by a subsequent auto-correlation and peak-finding operation, using the initial positions to filter out spurious peaks caused by repeating structure other than the test chart in the captured image.

In step 1530, the peak positions of the side-peaks are measured from the auto-correlation image. The peak positions can be measured to sufficient accuracy using a centroid calculation in a small region around each peak. As an alternative method, the peak positions can be measured using interpolation and quadratic peak fitting. For increased accuracy, the interpolation can use sync interpolation or Fourier interpolation.

In step 1540, the angle of the side-peaks in the auto-correlation image is measured. A line is drawn between the peak positions of the side-peaks. The angle of intersection between the line and the y axis is calculated. In step 1550, the focus position is calculated. This focal parameter is the axial position of the test chart relative to a focal position of the lens system.

For an ideal lens with zero aberrations, an exact relationship between the focus position and the angle can be calculated, as shown in FIG. 6. In practice, even a very high quality lens will have some small aberrations. These aberrations will make small changes to the angular response of the side-peaks with focus position. For maximum accuracy, these changes to the angular response should be compensated. One method for compensating is to measure the lens aberrations and re-calculate the angular response using an imaging simulation of the SLP pupil mask, the lens, and the measured lens aberrations. Another method for compensating is to calibrate the angular response for a specific lens by measuring the angular response with focus position, while measuring the focus position independently at high accuracy. For example, a high accuracy method of measuring the focus position would be to use a focus positioning stage with interferometric measurement of the position of the stage along the optical axis. The best focus position could be measured from a focus series of images with or without the SLP pupil mask. The image contrast can be measured and, if necessary, interpolated and enhanced using peak fitting to find an accurate best focus position that is independent of the SLP pupil mask method. The best focus position and the independent position measurements could be used together to produce a compensated angular response function. Once a compensated angular response function has been obtained for a specific lens, it can saved and later used with the measured angle to determine a more accurate focus position without relying on external measures of the focus position.

Figure 16:
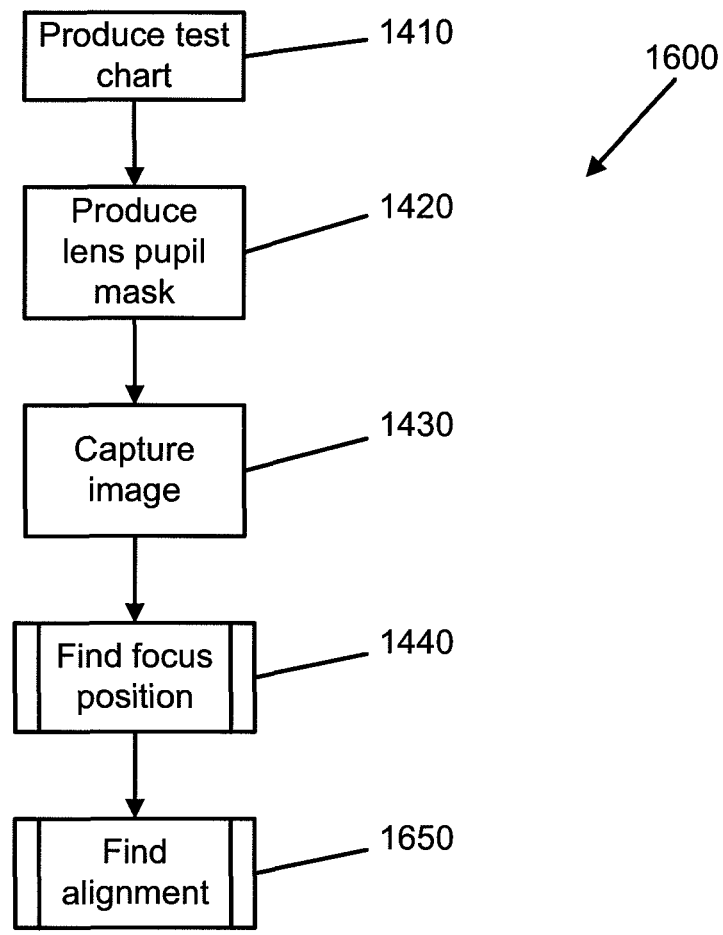
FIG. 16 is a flow chart of the focus and alignment finding method.

A summary of the combined focus and alignment detection method is shown in FIG. 16. Steps 1410 to 1440, as seen in FIG. 16, are the same as those shown in FIG. 14. In step 1650, the alignment is detected using the captured image.

Figure 17:
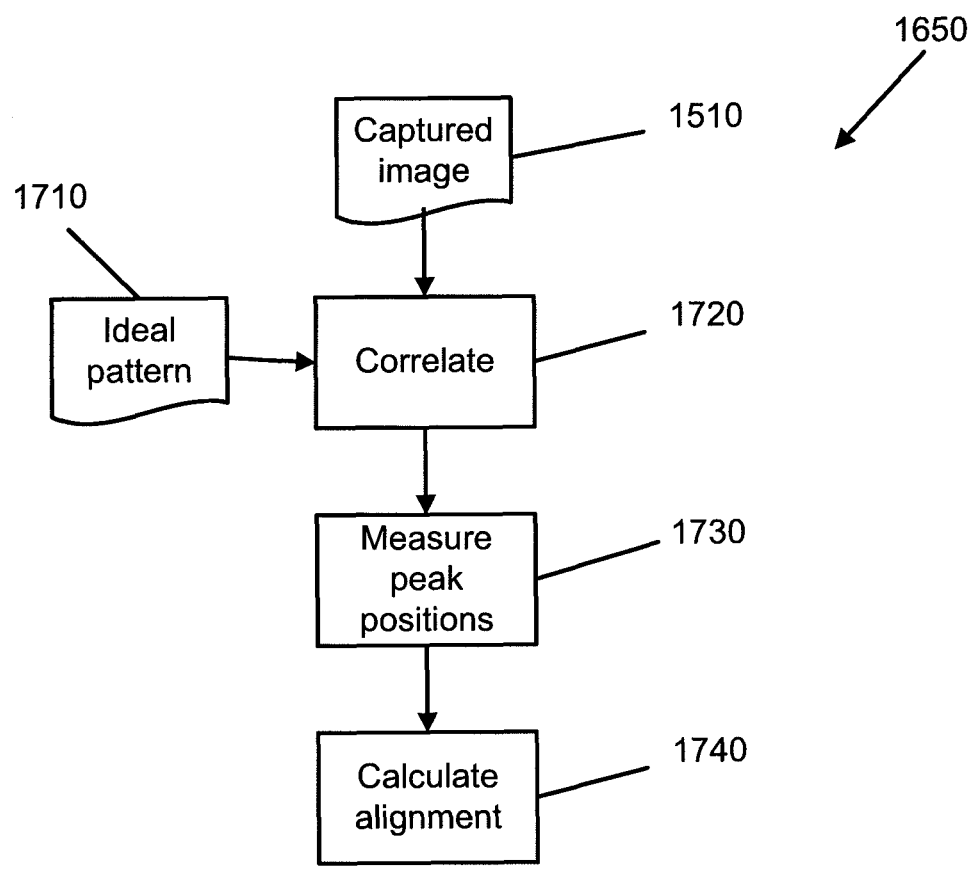
FIG. 17 is a flow chart of the alignment detection method.

The details of the alignment detection step 1650 are shown in FIG. 17. The captured image is shown at 1510. This is the same captured image that was used for focus detection in FIG. 15. An image of the ideal test pattern is shown at 1710. This ideal test pattern was used to generate the test chart in step 1410 in FIG. 14. In step 1720, the ideal test pattern image 1710 is correlated with the captured image 1510. The correlation can be a standard cross-correlation. For increased robustness against amplitude variations in the captured image 1510, a phase-correlation may be used instead of a standard cross-correlation. The sharpness of the correlation peaks can be enhanced using image filtering operations before and after correlation, such as downsampling, edge windowing and blurring, subtraction of the mean image value, removal of low spatial frequencies using a separable Hamming filter, and squaring the pixel values.

The correlation image will have two peaks. Each peak corresponds to an offset image copy produced in the captured image by the convolution of the test chart with one of the peaks in the SLP PSF. In step 1730, the peak positions are measured from the correlation image produced by step 1720. For increased accuracy, the peak positions can be measured using interpolation and peak fitting. In step 1740, the alignment is calculated using the measured peak positions. In step 1740, the mean of the two peak positions is calculated, then the offset between the mean peak position and the correlation image center is calculated. The offset is an estimate of the transverse alignment of the test chart image relative to the image sensor 1310. The offset can be converted to a physical distance using the size of the pixels and the image magnification.

The SLP focus and alignment detection method relies on an initial coarse alignment within a pre-determined tolerance. The alignment detection method using correlation with an ideal noise pattern relies on an accurate match of the scale and rotation with the ideal test pattern. If the initial alignment for scale, rotation, focus, and position is outside of the tolerance, then additional steps will be required to produce an accurate fine alignment. One method is to use a coarse alignment mark and a detection method for coarse alignment. For example, a low magnification image with a large depth of field could be captured of a large alignment mark, such as a cross-hair. This could be used to center the image on the noise test pattern before capturing an image at high magnification for accurate focus finding and alignment.

An alternative alignment detection method using correlation with an ideal LRHF pattern is robust to changes in scale and rotation. However, achieving accurate fine focus and alignment detection with an LRHF pattern will still require an initial coarse alignment and focus finding within a pre-determined tolerance. Because correlation with the LRHF patterns is robust to scale and magnification changes, the LRHF patterns could be used for both coarse and fine alignment and focus finding. An alternative method would be to use a LRHF pattern for coarse alignment for scale, rotation, position, and focus finding, and then, to use a noise pattern for fine alignment and focus finding.

Figure 18:
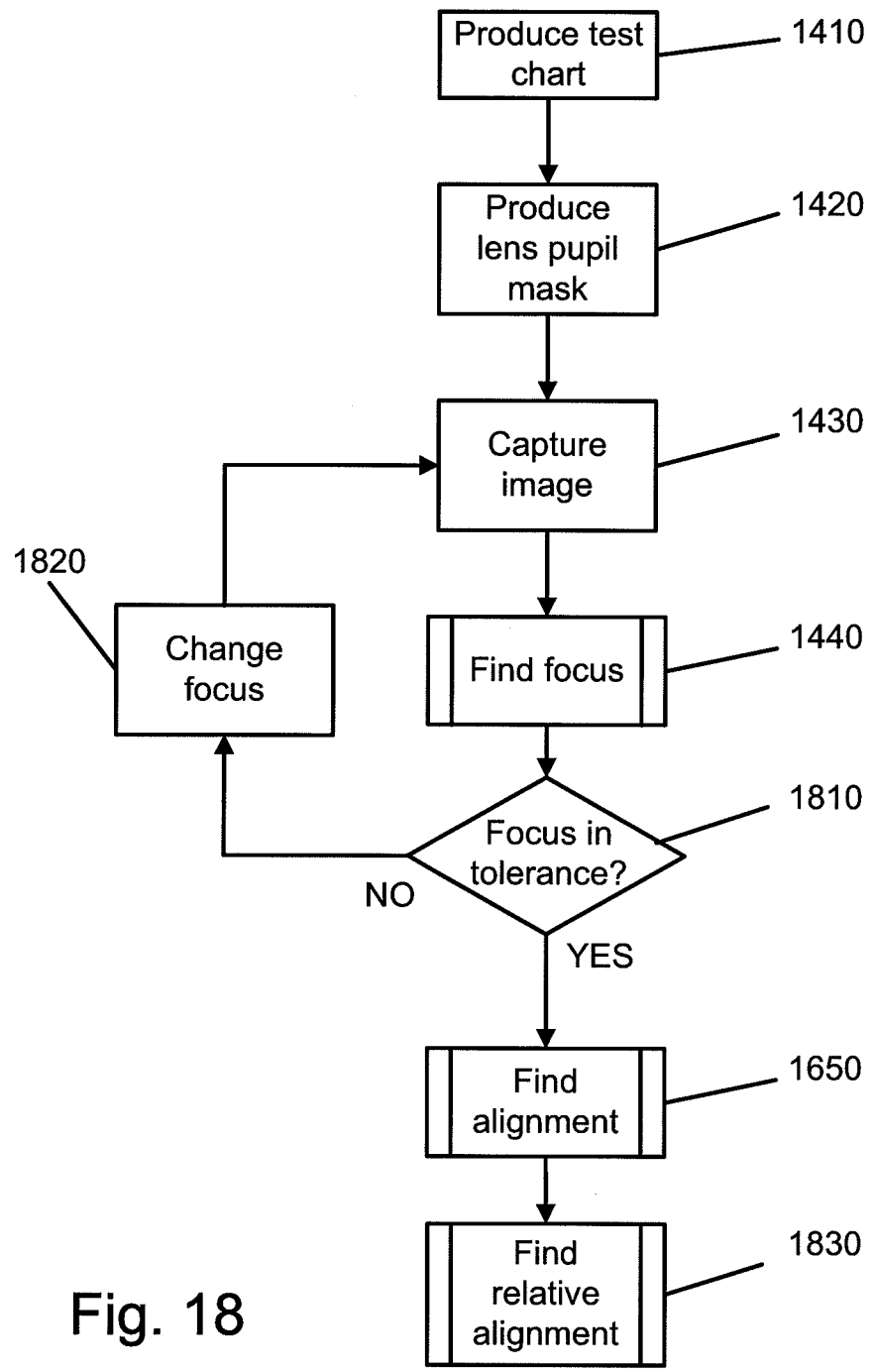
FIG. 18 is a flow chart of the focus, alignment, and relative alignment method.

The details of a specific method for iterative alignment are shown in FIG. 18. This method also includes absolute transverse alignment and relative alignment. Steps 1410 to 1440 are the same as those shown in FIG. 14. For step 1440, the coarse focus could be found using an additional method that is less precise than the SLP pupil mask method, but is more robust to large focus errors. For example, the image contrast could be calculated and compared to a calibrated measurement of the image contrast. But, this will not indicate whether the focus position is near focus or far focus. Another approach is a modification of the SLP detection method, which gives lower precision, but still returns to sign of the focus error. For example, instead of using peak finding, interpolation, and peak fitting to increase accuracy, the captured image or the auto-correlation image are down-sampled and smoothed to measure an approximate angle of the side-peaks in the auto-correlation.

In step 1810, a decision is made as to whether the focus position is within fine focus tolerance. For example, the auto-correlation side-peak angle, the approximate auto-correlation side-peak angle and the image contrast could be compared with predetermined thresholds. If step 1810 determines that the focus is outside of a fine focus tolerance, then control moves to step 1820. The approximate auto-correlation angle is used to change the focus position to within the fine focus tolerance. Control then returns to step 1430, where another image of the test pattern is captured. If step 1810 determines that the focus is inside the fine focus tolerance, then the focus position measurement from step 1440 is saved in the memory and control moves to step 1650. Step 1650 is the same measurement of absolute alignment position with respect to the image sensor as performed in FIG. 16. In step 1830, the relative alignment is measured between the image of two test charts on the same substrate. For example, the alignment can be measured between two test charts on the same wafer.

Figure 19:
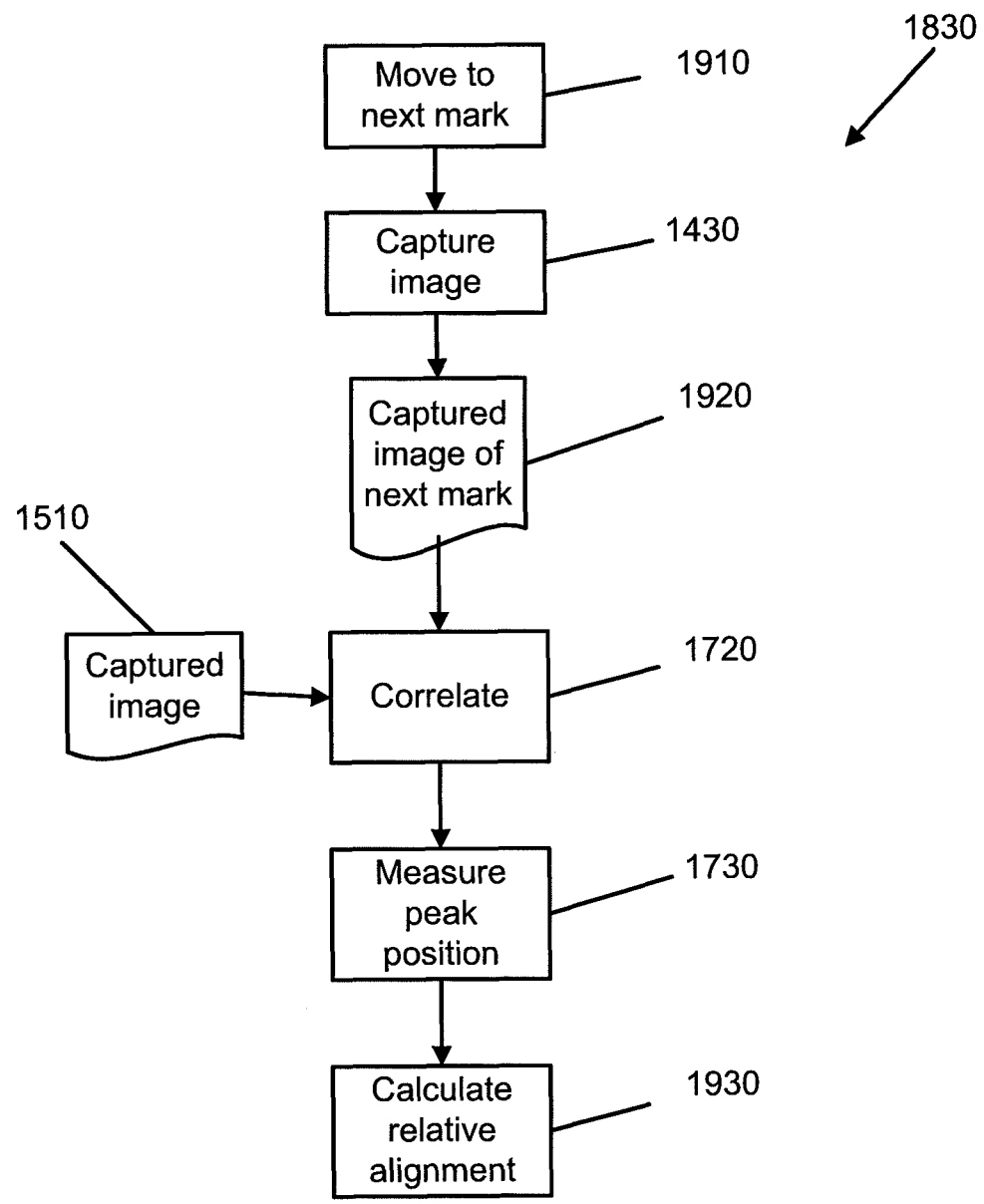
FIG. 19 is a flow chart of the relative alignment detection method.

The details of the relative alignment step 1830 are shown in more detail in FIG. 19. In step 1910, the substrate is moved to a second test chart that is at a different position on the substrate from the first test chart used for focus and alignment in steps 1440 and 1650 in FIG. 17. The second test chart should be produced from the same ideal test pattern as the first test chart. For example, the test chart could be a noise pattern with a high spatial frequency bandwidth. Still referring to FIG. 19, in step 1430, an image is captured of the second test chart. The captured image is shown in FIG. 19 at 1920. In step 1720, the captured image of the second test chart 1920 is correlated with the captured image of the first test chart 1510. The correlation image will have three peaks. The two side-peaks correspond to the two peaks in the SLP PSF. The middle peak corresponds to the offset between the alignment of the two test charts relative to the image sensor. In step 1730, the peak positions are measured using interpolation and peak fitting. In step 1930, the relative transverse alignment between the first test chart and the second test chart is calculated. For example, the middle peak could be selected from the three peaks in the correlation image. The position of the middle peak relative to the image center is an estimate of the relative alignment in pixels. Another method could combine the positions of all three peaks in order to increase the accuracy of the relative alignment.

The test charts and the images of the test charts may be degraded. For example, wafer processing such as chemical-mechanical polishing may change the appearance of the test charts. Aberrations or distortions in the lens or lens system may also change the appearance of the test charts. In FIG. 17, the correlation between the ideal test pattern and the captured image was used to measure the transverse alignment. But, if the captured image is degraded, then the correlation strength may be reduced relative to the imaging noise. The correlation strength will also decrease if the test chart is rotated or scaled compared with the ideal pattern. If the correlation strength is decreased, then the accuracy of the alignment measurement is reduced. But, in FIG. 19, the correlation is calculated between two images from the same substrate. This means that both images will have the same scale, rotation, and degradations, which will increase the correlation strength compared to a correlation calculated using the ideal test pattern.

The relative alignment is useful for alignment parameters that change within the same substrate. For example, if a wafer has been heated during processing, then the wafer may change in diameter. This may change the scale and position of test charts for different distances from the centre of the wafer. One method for compensating for this change would be to measure the alignment for each exposure position on the wafer. But, this method would take a significant amount of time. By measuring the relative alignment of a subset of the test charts at different distances from the wafer center, a fit could be calculated to a model of the wafer size change. The result from the fit could be used to increase the accuracy of predicting positions on the wafer that have not been measured. Because only a subset of the test charts are measured, the wafer alignment is faster.

The arrangements described above can be used for exposure tools designed for semiconductor production for a range of devices. These arrangements may provide an advantage whenever speed and accuracy are important features of focus finding and alignment operations within the exposure tool. Example devices include integrated circuits (IC), large scale integrated (LSI) circuits, system-on-a-chip (SOC), or image sensors such as charge-coupled devices (CCD), or complementary metal-oxide-semiconductor (CMOS) sensors. The arrangements may also be used for exposure tools designed for pattern reproduction on a different type of substrate. For example, the arrangements may be used in an exposure tool used to fabricate liquid crystal (LCD) displays.

INDUSTRIAL APPLICABILITY

The arrangements described are applicable to optical imaging industries and, particularly, for high tolerance manufacturing requiring alignment, such as integrated circuit processing.

The foregoing describes only some embodiments of the present invention, and modifications and/or changes can be made thereto without departing from the scope and spirit of the invention, the embodiments being illustrative and not restrictive.

We claim:

1. A method of determining a focus parameter for aligning a wafer in an exposure tool within a measurement tolerance required for the exposure tool, the exposure tool using a lens system for alignment, said method comprising the steps of:
   (a) providing a test chart associated with the wafer, the test chart having a sharp auto-correlation;
   (b) capturing, using a lens pupil mask, an image of the test chart, the lens pupil mask having at least two phase ramps that are non-parallel;
   (c) auto-correlating the captured image of the test chart to determine the position of the test chart relative to a focal position of the lens system; and
   (d) determining the focus parameter for alignment of the wafer using the determined position of the test chart, whereby the focus parameter is determined within the measurement tolerance required by the exposure tool.

2. The method of claim 1, wherein the phase ramps are linear.

3. The method of claim 1, wherein the phase ramps are the sum of a linear phase ramp and a defocus phase function.

4. The method of claim 1, wherein the test chart is located on the wafer.

5. The method of claim 1, wherein the test chart has at least one of a high spatial frequency bandwidth and a rotational diversity.

6. The method of claim 1, wherein the test chart is a pseudo-random noise pattern adapted to provide a measurement tolerance required for the exposure tool.

7. The method of claim 1, wherein the test chart is a logarithmic radial harmonic function defined as follows:

$$f_1(r,\theta)=Re\{w(r,\theta)r^{i\alpha+p}e^{ik\theta}\},\ r>r_0$$

where $\alpha\neq 0$ and $k\neq 0$.

8. A method according to claim 1, wherein the test chart is a logarithmic radial harmonic function defined as follows:

$$f_1(r,\theta)=\begin{cases}Re[w(r,\theta)r^{i\alpha+p}e^{ik\theta}], & r>r_0\\ q, & r\leq r_0\end{cases}$$

where $\alpha\neq 0$ and $k\neq 0$.

9. A method according to claim 1, wherein the test chart is an inherent structure of the substrate.

10. A method according to claim 1, wherein the phase ramps are wrapped at steps of one wavelength of illuminating light associated with the exposure tool.

11. A method according to claim 1, wherein the focus parameter is determined by detecting the position of the side-peaks in the auto-correlation image.

12. A method according to claim 1, wherein an alignment parameter for aligning the wafer is also determined by correlating the captured image with one of an ideal test pattern image and a reference image.

13. A method according to claim 1, wherein the lens system is one of an exposure lens in the exposure tool and an alignment microscope lens in the exposure tool.

14. A method according to claim 1, wherein the lens pupil mask is inserted in a conjugate plane of the lens system.

15. A method of focusing a lens system for an exposure tool to align a wafer within a measurement tolerance required for the exposure tool, said method comprising the steps of:
(a) providing a test chart associated with the wafer, the test chart having a sharp auto-correlation;
(b) capturing, using a lens pupil mask, an image of the test chart, the lens pupil mask having at least two phase ramps that are non-parallel;
(c) auto-correlating the captured image of the test chart to determine the position of the test chart relative to a focal position of the lens system; and
(d) focusing the lens system to align the wafer using the determined position of the test chart, whereby the wafer is aligned within the measurement tolerance required by the exposure tool.

16. A non-transitory computer readable storage medium having a computer program recorded thereon, the program being executable in a computer apparatus to determine a focus parameter for aligning a wafer in an exposure tool within a measurement tolerance required for the exposure tool, the exposure tool using a lens system for alignment, the program comprising:
a code for providing a test chart associated with the wafer, the test chart having a sharp auto-correlation;
a code for capturing, using a lens pupil mask, an image of the provided test chart associated with the wafer, the lens pupil mask having at least two phase ramps that are non-parallel;
a code for auto-correlating the captured image of the test chart to determine the position of the test chart relative to a focal position of the lens system; and
a code for determining the focus parameter for alignment of the wafer using the determined position of the test chart, whereby the focus parameter is determined within the measurement tolerance required by the exposure tool.

17. An exposure tool arrangement having a lens system for alignment of a wafer in an exposure tool, said arrangement comprising:
a test chart associated with the wafer, the test chart having a sharp auto-correlation;
a lens pupil mask having at least two non-parallel phase ramps;
an image sensor configured for capturing, using the lens pupil mask, an image of the test chart; and
a computer configured for:
(i) auto-correlating the captured image of the test chart to determine the position of the test chart relative to a focal position of the lens system; and
(ii) determining a focus parameter of the lens system for alignment of the wafer using the determined position of the test chart, whereby the focus parameter is determined within a measurement tolerance required by the exposure tool.

18. A method of determining a focus parameter for aligning a wafer in an exposure tool within a measurement tolerance required for the exposure tool, the exposure tool using a lens system for alignment, said method comprising:
providing a test chart associated with the wafer, the test chart having a sharp auto-correlation, a high spatial frequency bandwidth, and rotational diversity;
capturing, using a lens pupil mask, an image of the test chart, the lens pupil mask having at least two phase ramps that are non-parallel;
determining the position of the test chart relative to a focal position of the lens system; and
determining the focus parameter for alignment of the wafer using the determined position of the test chart, whereby the focus parameter is determined within the measurement tolerance required by the exposure tool.

\* \* \* \* \*